(12) United States Patent
Kim et al.

(10) Patent No.: US 9,899,497 B2
(45) Date of Patent: Feb. 20, 2018

(54) METHOD OF FABRICATING SEMICONDUCTOR DEVICE

(71) Applicant: SAMSUNG ELECTRONICS CO., LTD., Suwon-si (KR)

(72) Inventors: Jin Bum Kim, Seoul (KR); Kang Hun Moon, Incheon (KR); Choeun Lee, Pocheon-si (KR); Kyung Yub Jeon, Yongin-si (KR); Sujin Jung, Hwaseong-si (KR); Haegeon Jung, Yongin-si (KR); Yang Xu, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/355,781

(22) Filed: Nov. 18, 2016

(65) Prior Publication Data

US 2017/0162674 A1    Jun. 8, 2017

(30) Foreign Application Priority Data

Dec. 3, 2015 (KR) .......................... 10-2015-0171651

(51) Int. Cl.
| | |
|---|---|
| *H01L 29/66* | (2006.01) |
| *H01L 29/08* | (2006.01) |
| *H01L 21/306* | (2006.01) |
| *H01L 21/02* | (2006.01) |

(52) U.S. Cl.
CPC .... *H01L 29/66795* (2013.01); *H01L 21/0243* (2013.01); *H01L 21/02381* (2013.01); *H01L 21/02433* (2013.01); *H01L 21/02532* (2013.01); *H01L 21/30604* (2013.01); *H01L 29/0847* (2013.01); *H01L 29/66545* (2013.01); *H01L 29/66636* (2013.01)

(58) Field of Classification Search
CPC ......... H01L 29/66409; H01L 29/66477; H01L 29/66545; H01L 29/66795; H01L 29/66568; H01L 29/66636; H01L 21/02381; H01L 21/0243; H01L 21/02433; H01L 21/02532; H01L 21/30604; H01L 21/823418; H01L 29/0684; H01L 29/0688
See application file for complete search history.

(56) References Cited

U.S. PATENT DOCUMENTS

| | | | |
|---|---|---|---|
| 7,838,372 B2 | 11/2010 | Han et al. | |
| 8,071,481 B2 | 12/2011 | Kao et al. | |
| 8,264,032 B2 * | 9/2012 | Yeh | ........... H01L 29/66795 257/327 |

(Continued)

*Primary Examiner* — Scott B Geyer
(74) *Attorney, Agent, or Firm* — Sughrue Mion, PLLC

(57) ABSTRACT

A method of fabricating a semiconductor device is disclosed. The method includes forming an active pattern protruding orthogonally from a substrate; forming a preliminary gate structure on the active pattern to cross the active pattern; etching the active pattern to form preliminary recess regions at both sides of the preliminary gate structure, wherein each of the preliminary recess regions is formed to define a delta region in an upper portion of the active pattern; forming a sacrificial layer on inner side surfaces and a bottom surface of the active pattern exposed by each of the preliminary recess regions; etching the delta regions and the sacrificial layer to form recess regions having a 'U'-shaped section; and forming source/drain regions in the recess regions.

20 Claims, 23 Drawing Sheets

(56) References Cited

U.S. PATENT DOCUMENTS

| | | | |
|---|---|---|---|
| 9,034,706 B2* | 5/2015 | Liu | H01L 29/66795 |
| | | | 257/E21.431 |
| 9,142,642 B2 | 9/2015 | Chen et al. | |
| 9,240,460 B2 | 1/2016 | Kim et al. | |
| 9,263,342 B2 | 2/2016 | Lee et al. | |
| 9,490,258 B2* | 11/2016 | Jeong | H01L 27/1104 |
| 9,685,385 B1* | 6/2017 | Hung | H01L 21/823821 |
| 9,691,901 B2* | 6/2017 | Shen | H01L 29/7848 |
| 2007/0054447 A1* | 3/2007 | Tai | H01L 29/6656 |
| | | | 438/197 |
| 2008/0146034 A1 | 6/2008 | Shen et al. | |
| 2009/0289379 A1 | 11/2009 | Han et al. | |
| 2010/0270598 A1 | 10/2010 | Kao et al. | |
| 2011/0079820 A1* | 4/2011 | Lai | H01L 21/3247 |
| | | | 257/190 |
| 2013/0207166 A1 | 8/2013 | Chen et al. | |
| 2013/0228862 A1* | 9/2013 | Lee | H01L 21/823807 |
| | | | 257/347 |
| 2014/0220752 A1 | 8/2014 | Park et al. | |
| 2015/0001584 A1 | 1/2015 | Huang et al. | |
| 2015/0011070 A1 | 1/2015 | Kim et al. | |
| 2015/0031182 A1 | 1/2015 | Perng et al. | |
| 2015/0104913 A1* | 4/2015 | Liu | H01L 21/823821 |
| | | | 438/229 |
| 2015/0140756 A1 | 5/2015 | Yu et al. | |
| 2015/0140757 A1 | 5/2015 | Kim et al. | |
| 2015/0357436 A1* | 12/2015 | Shen | H01L 29/66636 |
| | | | 257/190 |
| 2016/0087104 A1* | 3/2016 | Lee | H01L 29/7851 |
| | | | 257/192 |
| 2017/0053921 A1* | 2/2017 | Jeong | H01L 27/1104 |

\* cited by examiner

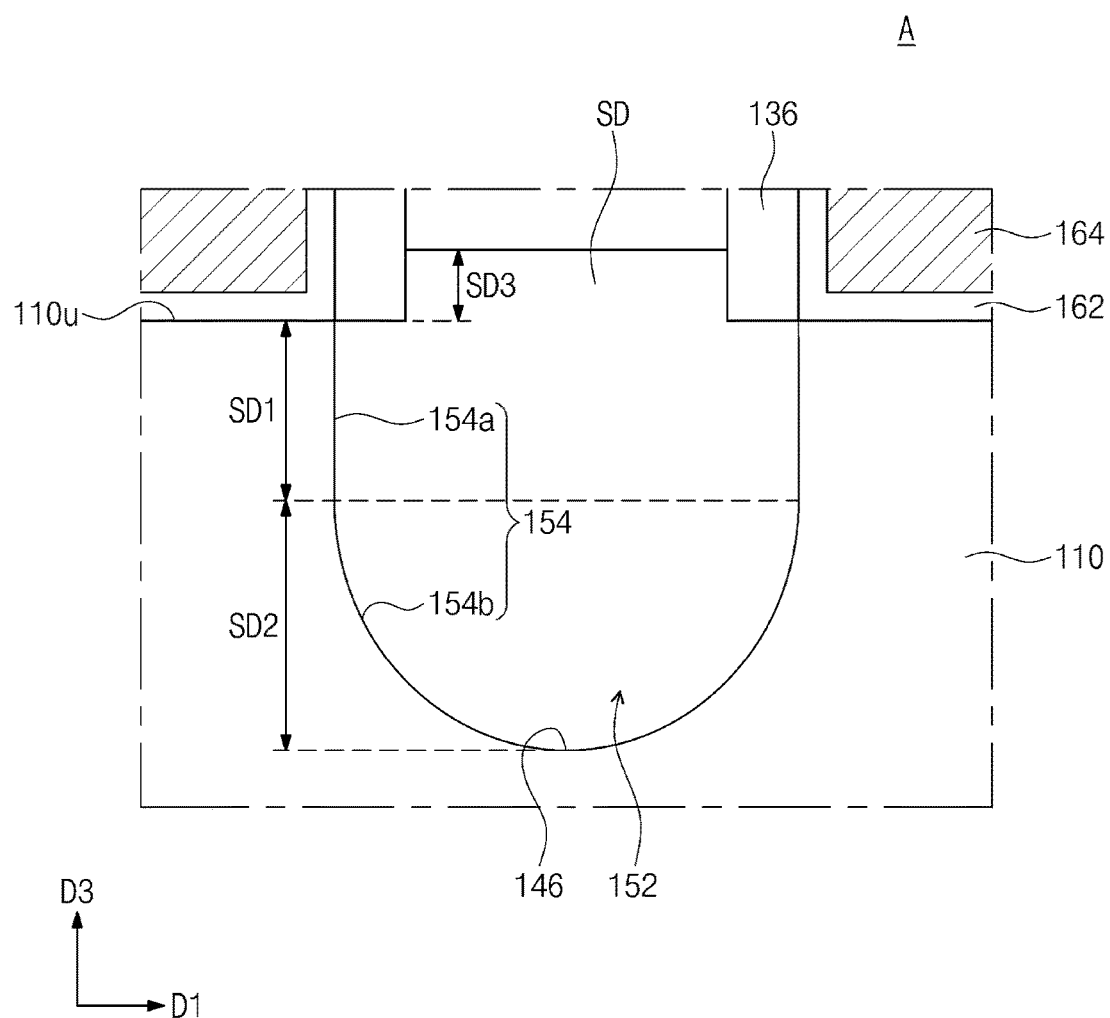

METHOD OF FABRICATING SEMICONDUCTOR DEVICE

CROSS-REFERENCE TO RELATED APPLICATIONS

This application claims priority from Korean Patent Application No. 10-2015-0171651, filed on Dec. 3, 2015 in the Korean Intellectual Property Office, the entire contents of which are hereby incorporated by reference.

BACKGROUND

The present disclosure relates to a semiconductor device and a method of fabricating the same, and in particular, to a fin field effect transistor (Fin FET) and a method of fabricating the same.

A semiconductor device may include an integrated circuit (IC) composed of a plurality of metal oxide semiconductor field effect transistors (MOSFETs). As reduction in size and design rule of the semiconductor device is accelerated, the MOS-FETs are being scaled down. The reduction in size of the MOS-FET may lead to deterioration (e.g., a short channel effect) in operational properties of the semiconductor device. Various studies are being conducted to overcome technical limitations associated with the scale-down of the semiconductor device and to provide a high-performance semiconductor device.

SUMMARY

One or more example embodiments provide a method of fabricating a highly-reliable semiconductor device.

According to an aspect of an example embodiment, a method of fabricating a semiconductor device may include forming an active pattern protruding orthogonally from a substrate; forming a preliminary gate structure on the active pattern to cross the active pattern; etching the active pattern to form preliminary recess regions at both sides of the preliminary gate structure, wherein each of the preliminary recess regions is formed to define a delta region in an upper portion of the active pattern; forming a sacrificial layer on inner side surfaces and a bottom surface of the active pattern exposed by each of the preliminary recess regions; etching the delta regions and the sacrificial layer to form recess regions having a 'U'-shaped section; and forming source/drain regions in the recess regions, respectively.

According to an aspect of another example embodiment, a method of fabricating a semiconductor device may include forming a pattern structure on an etch target layer; etching the etch target layer using the pattern structure as an etch mask to form a preliminary recess region; and epitaxially forming a sacrificial layer on the preliminary recess region, wherein a growth rate of the sacrificial layer is higher at an upper region of the preliminary recess region than the growth rate of the sacrificial layer at a lower region of the preliminary recess region.

According to an aspect of another example embodiment, a method of fabricating a semiconductor device may include forming an active pattern on a substrate, the active pattern being orthogonal to the substrate; forming at least two preliminary gate structures on the active pattern to cross the active pattern; etching the active pattern between the preliminary gate structures to form a preliminary recess region extending into the active pattern in a recess direction, side portions of the preliminary recess region extending under a portion of the preliminary gate structures; forming a sacrificial layer on the active pattern of the preliminary recess region, the sacrificial layer having a position-dependent thickness in the preliminary recess region; etching the sacrificial layer to form a recess region; and forming a source/drain region in the recess region.

BRIEF DESCRIPTION OF THE DRAWINGS

Example embodiments will be more clearly understood from the following brief description taken in conjunction with the accompanying drawings which represent non-limiting, example embodiments, in which:

FIGS. 1C and 1D are enlarged sectional views illustrating a portion 'A' of FIG. 1B;

FIGS. 2A to 9A are sectional views illustrating a method of fabricating a semiconductor device according to some example embodiments;

FIGS. 2B to 9B are sectional views taken along lines I-I', II-II', and III-III' of FIGS. 2A to 9A, respectively;

FIGS. 4C to 6C are enlarged sectional views illustrating portions 'A' of FIGS. 2B to 6B, respectively.

DETAILED DESCRIPTION

Example embodiments will now be described more fully hereinafter with reference to the accompanying drawings. It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

As used herein, the singular terms "a," "an" and "the" are intended to include the plural forms as well, unless the context clearly indicates otherwise. It will be understood that when an element is referred to as being "connected" or "coupled" to another element, it may be directly connected or coupled to the other element or intervening elements may be present. Further, phrases such as "at least one of A and B" means A alone, B alone, or A and B together.

Similarly, it will be understood that when an element such as a layer, region or substrate is referred to as being "on" another element, it can be directly on the other element or intervening elements may be present. In contrast, the term "directly" means that there are no intervening elements.

Figure 1A:
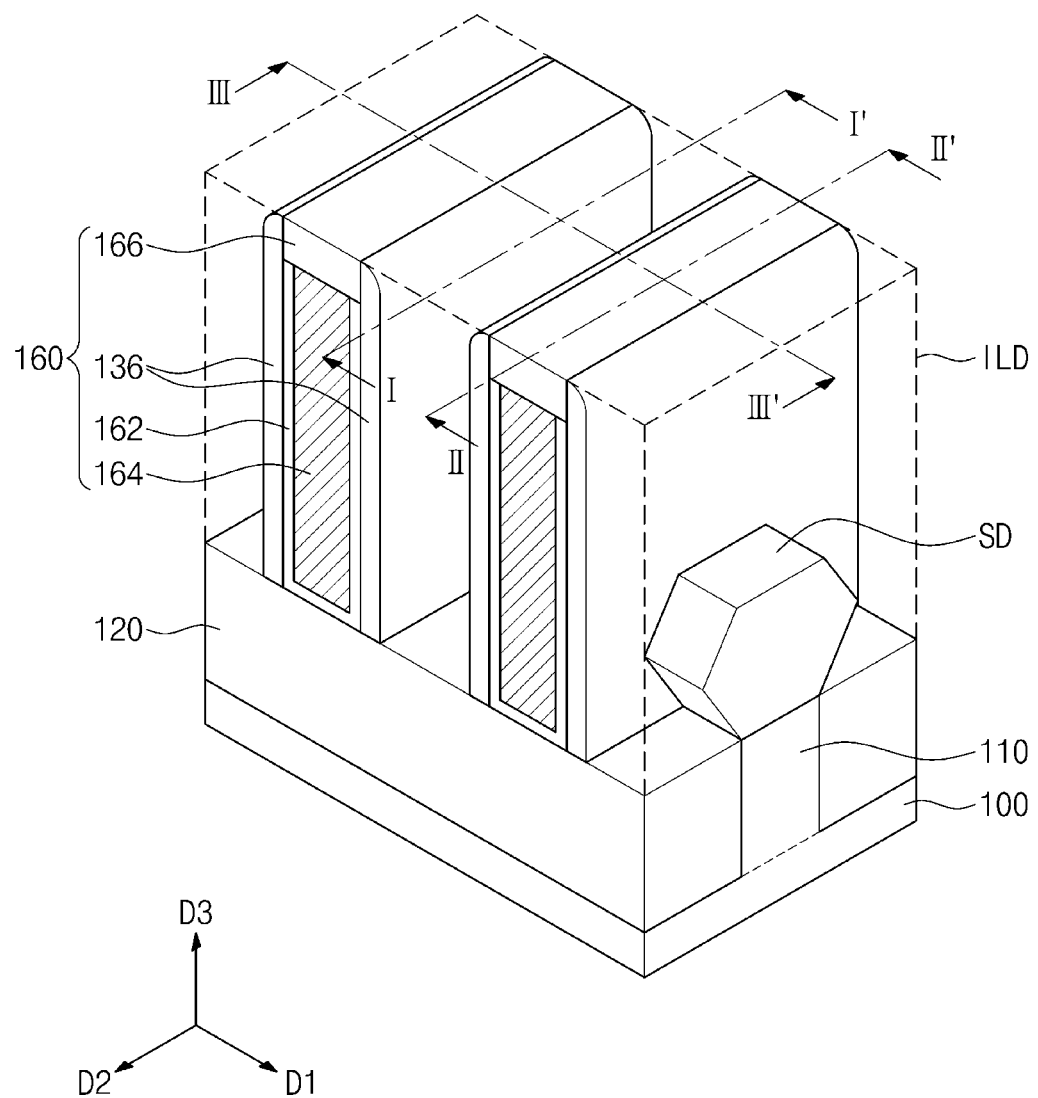
FIG. 1A is a perspective view illustrating a semiconductor device according to some example embodiments.
Figure 1B:
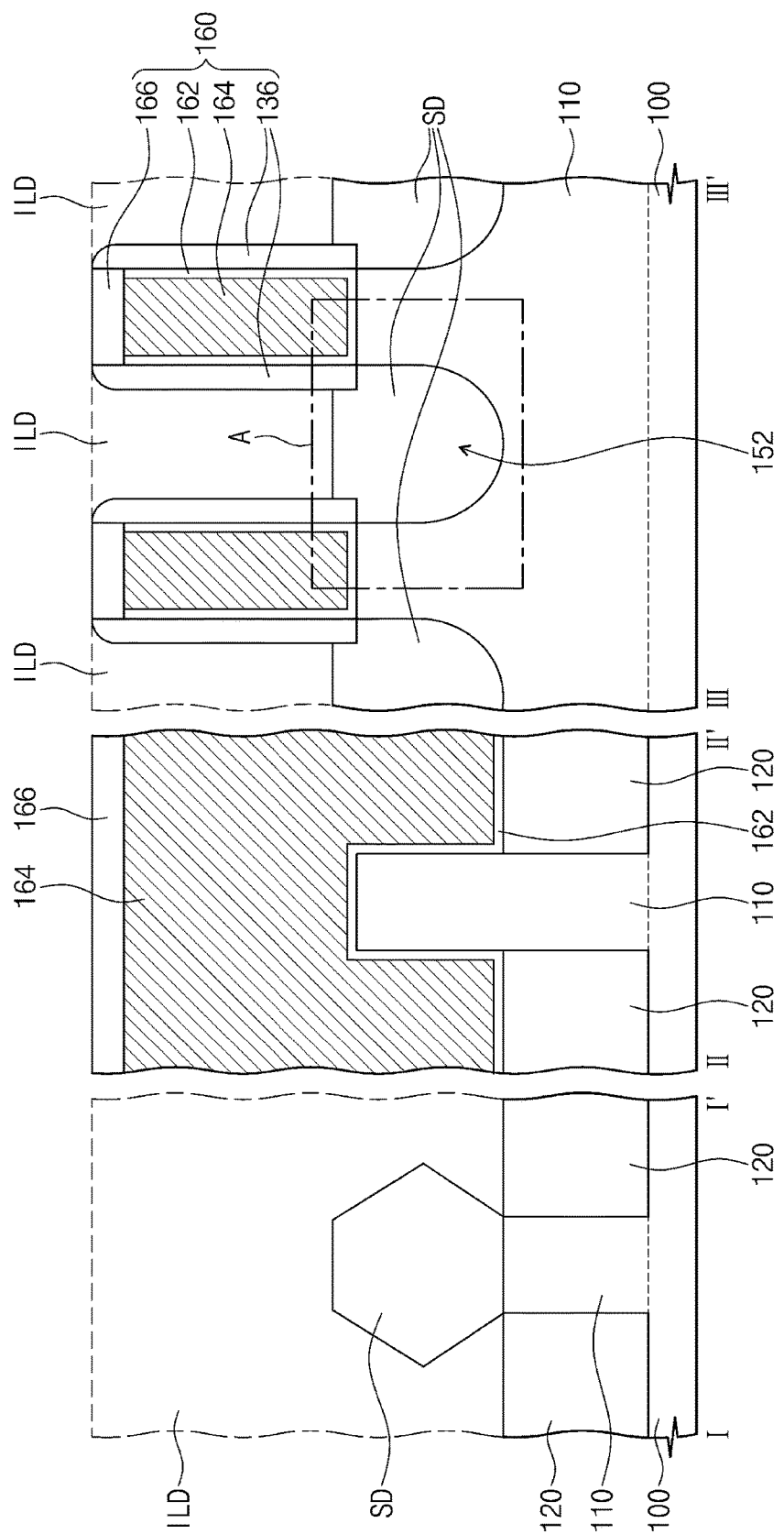
FIG. 1B are sectional views of the semiconductor device, which are taken along lines I-I', II-II', and III-III' of FIG. 1A.
Figure 1D:
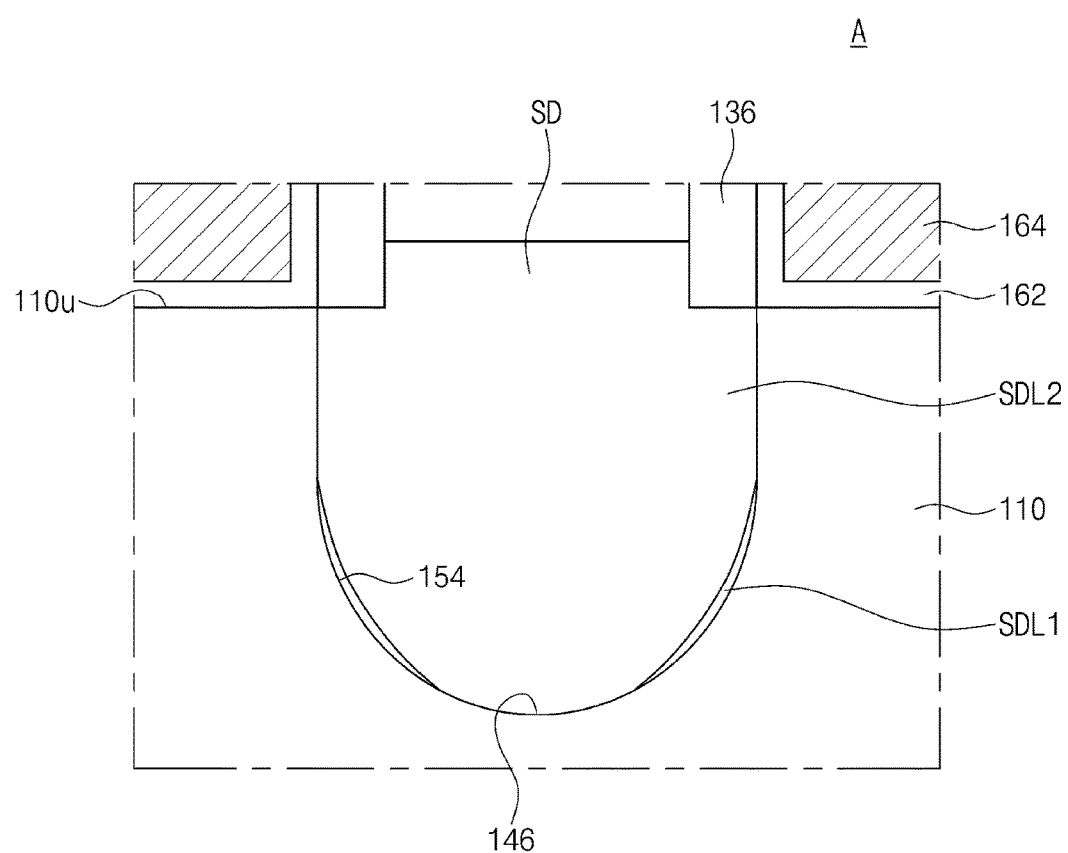

FIG. 1A is a perspective view illustrating a semiconductor device according to some example embodiments. FIG. 1B is sectional views of the semiconductor device, which are taken along lines I-I', II-II', and III-III' of FIG. 1A. FIGS. 1C and 1D are enlarged sectional views illustrating a portion 'A' of FIG. 1B.

Referring to FIGS. 1A, 1B, and 1C, a semiconductor device may include a substrate 100, an active pattern 110, gate structures 160, and source/drain regions SD.

The substrate 100 may be a semiconductor substrate 100. For example, the substrate 100 may be a silicon wafer, a semiconductor substrate containing germanium or silicon/germanium, a silicon-on-insulator (SOI) wafer, a germanium-on-insulator (GOI) wafer, or a structure with an epitaxial silicon layer.

The active pattern 110 may be provided on the substrate 100. In some example embodiments, the active pattern 110 may be provided to protrude upward from the substrate 100 in a third direction D3 and extend on the substrate 100 in a first direction D1. The active pattern 110 may include substantially the same material as the substrate 100, but the inventive concept may not be limited thereto.

In some example embodiments, a buffer layer may be further provided between the substrate 100 and the active pattern 110. The buffer layer may have the same lattice structure as, but a different lattice constant from, the substrate 100 and the active pattern 110. Accordingly, the buffer layer may apply strain to the active pattern 110. In certain example embodiments, the buffer layer may be omitted.

Device isolation patterns 120 may be provided at both sides of the active pattern 110. The device isolation patterns 120 may be provided on the substrate 100 and may extend in a first direction D1. The device isolation patterns 120 may be spaced apart from each other in a second direction D2, which is perpendicular to the first direction D1, and the active pattern 110 may be interposed between the device isolation patterns 120. Here, the active pattern 110 may protrude in the third direction D3 that is perpendicular to the first and second directions D1 and D2 (i.e., that is orthogonal to the substrate 100). The device isolation patterns 120 may be provided to expose an upper portion of the active pattern 110. The active pattern 110 may have a top surface and a portion of a side surface exposed by the device isolation patterns 120. The top surfaces of the device isolation patterns 120 may be lower than that of the active pattern 110. The device isolation patterns 120 may be formed of or include at least one of silicon oxide, silicon nitride, and silicon oxynitride.

The gate structures 160 may be provided on the substrate 100. The gate structures 160 may be spaced apart from each other in the first direction D1, and each of the gate structures 160 may extend in the second direction D2 to cross the active pattern 110. Each of the gate structures 160 may be provided to face the exposed surfaces of the active pattern 110 and may be extended to face the top surfaces of the device isolation patterns 120. A portion of the active pattern 110 positioned below each of the gate structures 160 may be used as a channel region of the transistor including the gate structure 160 and the source/drain regions SD. The transistor may be a PMOSFET or an NMOSFET.

Each of the gate structures 160 may include a gate electrode 164, a gate insulating pattern 162, a capping pattern 166, and gate spacers 136. Here, the gate electrode 164 may have a structure extending in the second direction D2, the gate insulating pattern 162 may be interposed between the gate electrode 164 and the active pattern 110, the capping pattern 166 may be provided to cover a top surface of the gate electrode 164, and the gate spacers 136 may be provided on opposite sidewalls of the gate electrode 164. The gate insulating pattern 162 may include portions that are interposed between the gate electrode 164 and the device isolation patterns 120 and between the gate electrode 164 and the gate spacers 136.

The gate electrode 164 may be formed of or include at least one of conductive metal nitrides (e.g., titanium nitride or tantalum nitride) or at least one of metals (e.g., aluminum, tungsten, or copper). The gate insulating patterns 162 may be formed of or include at least one of high-k dielectric materials (e.g., hafnium oxide, hafnium silicate, zirconium oxide, or zirconium silicate). The capping pattern 166 and the gate spacers 136 may be formed of or include at least one of silicon oxide, silicon nitride, and silicon oxynitride.

The active pattern 110 may be provided to have a recess region 152 (see FIG. 1B) between the gate structures 160. In some example embodiments, the recess region 152 may be formed between an adjacent pair of the gate spacers 136. The recess region 152 may be overlapped with the gate spacers 136. Referring to FIG. 1C, when viewed in a vertical section, the recess region 152 may be shaped like a letter 'U'. For example, the recess region 152 may include a pair of inner side surfaces 154, which are spaced apart from each other in the first direction D1, and a bottom surface 146. The bottom surface 146 may connect the inner side surfaces 154 to each other. The bottom surface 146 may have a rounded shape.

The source/drain regions SD may be provided between the gate structures 160 to fill the recess regions 152. In the case where the transistor is a PMOSFET, the source/drain regions SD may be formed of or include a p-type silicon germanium (e.g., doped with boron). In this case, a portion of the active pattern 110 below the gate structure 160 may serve as a channel region of the transistor, and a compressive stress from the source/drain regions SD may be applied to the channel region. In the case where the transistor is an NMOSFET, the source/drain regions SD may be formed of or include an n-type silicon (e.g., doped with phosphorus or nitrogen). In this case, a tensile stress from the source/drain regions SD may be applied to the channel region.

Each of the source/drain regions SD may include a first source/drain portion SD1 and a second source/drain portion SD2, which are provided at a level lower than a top surface 110u of the active pattern 110. The source/drain regions SD may further include a third source/drain portion SD3, which is provided at a level higher than the top surface 110u of the active pattern 110. The third source/drain portion SD3 may be in contact with the first source/drain portion SD1. The first source/drain portion SD1 may be provided adjacent to the top surface 110u of the active pattern 110. The second source/drain portion SD2 may be provided under the first source/drain portion SD1. The first and second source/drain portions SD1 and SD2 may be in contact with the inner wall 154 of the recess region 152.

The first source/drain portion SD1 may have inner side surfaces 154a that are opposite to each other and are substantially perpendicular to the top surface 110u of the active pattern 110, and the second source/drain portion SD2 may have an inner side surface 154b that is connected to the bottom surface 146. The inner side surface 154b may be connected to the bottom surface 146 at an obtuse angle in some example embodiments. The inner side surfaces 154a may be spaced apart from each other by substantially the same horizontal distance. The inner side surfaces 154b of the second source/drain portion SD2 may have a decreasing width in a direction toward the bottom surface 146, as shown in FIG. 1C. The third source/drain portion SD3 may have a structure extending from the first source/drain portion SD1 toward the top surface 110u of the active pattern 110; for example, the third source/drain portion SD3 may have a polygonal section.

Since the active pattern 110 has a three-dimensional structure, the channel region between the source/drain regions SD may have a multi-channel structure. In some cases, it may be advantageous to realize a uniform length of the channel region, regardless of a depth of the channel region. Since the first source/drain portion SD1 has substantially the same width, the first source/drain portion SD1 may make it possible to realize the uniform length of the channel region. Although a portion of the active pattern 110 positioned between the second source/drain portions SD2 is used as a part of the channel region, the first source/drain portion SD1 may be used as a main part of the channel region. In addition, the third source/drain portions SD3 may be mainly used for an electrical connection with first contact plugs, which will be described below. Accordingly, in the case where the first source/drain portions SD1 are formed to have a substantially uniform width, it is possible to reduce a variation in channel length of the channel region (e.g., in distance between the source/drain regions SD).

In certain example embodiments, referring to FIG. 1D, in the case where the transistor is a PMOSFET, the source/drain region SD may include a first layer SDL1 and a second layer SDL2. The first layer SDL1 may be provided to be in contact with the inner side surfaces 154 and the bottom surface 146 of the recess region 152. The first layer SDL1 may be continuously or discontinuously formed on the inner side surfaces 154 and the bottom surface 146. The second layer SDL2 may be provided to fill the recess region 152 provided with the first layer SDL1 and to have a protruding portion, whose top surface is higher than the top surface 110$u$ of the active pattern 110. The first layer SDL1 may be formed of or include an undoped silicon germanium layer, and the second layer SDL2 may be formed of or include a p-type silicon germanium layer. The first and second layers SDL1 and SDL2 may be provided to have germanium concentrations different from each other. In certain example embodiments, the first layer SDL1 may be omitted from the recess region 152, and the second layer SDL2 may be formed to completely fill the recess region 152.

In the case where the transistor is an NMOSFET, the source/drain regions SD may include a first layer SDL1 and a second layer SDL2. The first layer SDL1 may be provided to be adjacent to the inner side surfaces 154 and the bottom surface 146. The first layer SDL1 may be continuously or discontinuously formed on the inner side surfaces 154 and the bottom surface 146. The second layer SDL2 may be provided to fill the recess region 152 provided with the first layer SDL1 and to have a protruding portion, whose top surface is higher than the top surface 110$u$ of the active pattern 110. The first layer SDL1 may be formed of or include an undoped silicon layer, and the second layer SDL2 may be formed of or include a silicon layer doped with n-type dopants. In certain example embodiments, the first layer SDL1 may be omitted from the recess region 152, and the second layer SDL2 may be formed to completely fill the recess region 152.

A lower interlayered insulating layer ILD (see FIG. 1A) may be provided on the substrate 100 to cover the source/drain regions SD. The lower interlayered insulating layer ILD may be formed of or include at least one of a silicon oxide layer, a silicon nitride layer, and a silicon oxynitride layer.

An upper interlayered insulating layer may be provided on the substrate 100 including the gate structures 160. The upper interlayered insulating layer may include oxide, nitride, and/or oxynitride. Contact plugs may be provided to penetrate the upper interlayered insulating layer and the lower interlayered insulating layer ILD and to be electrically connected to the source/drain regions SD. The contact plugs may be coupled to the third source/drain portions SD3 of the source/drain regions SD, respectively.

FIGS. 2A to 9A are sectional views illustrating a method of fabricating a semiconductor device according to some example embodiments. FIGS. 2B to 9B are sectional views taken along lines I-I', II-II', and III-III' of FIGS. 2A to 9A, respectively. FIGS. 4C to 6C are enlarged sectional views illustrating portions 'A' of FIGS. 2B to 6B, respectively.

For concise description, elements previously described with reference to FIGS. 1A to 1D may be represented by similar or identical reference numbers and redundant description thereof may be omitted.

Figure 2A:
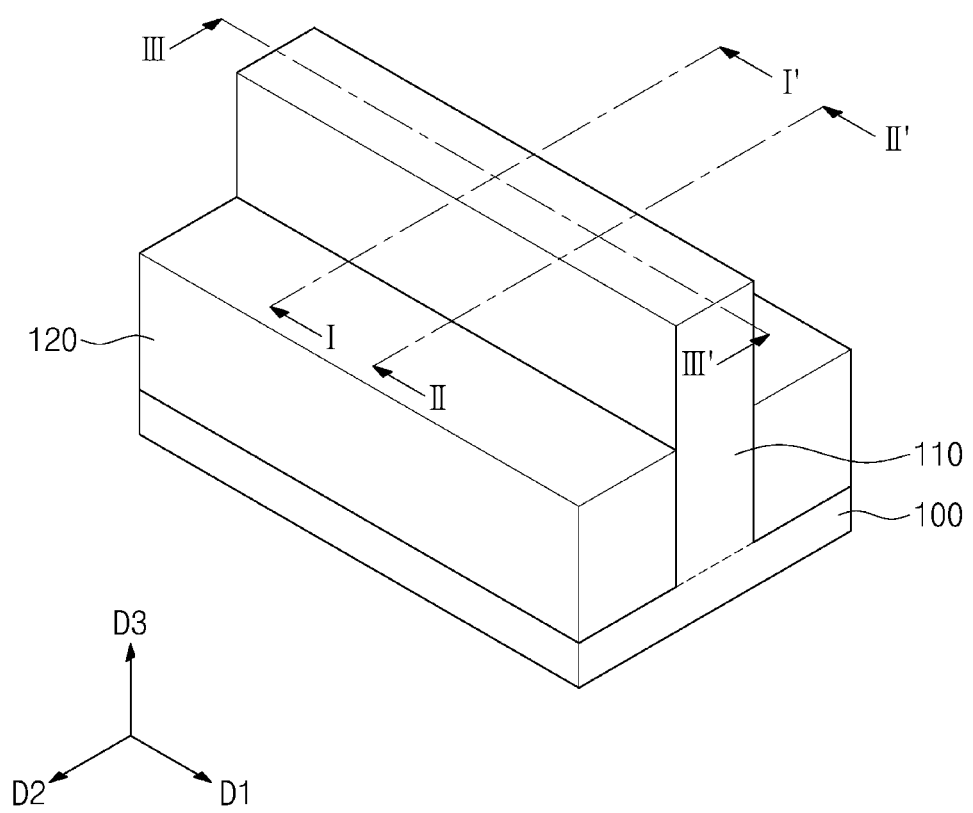
Figure 2B:
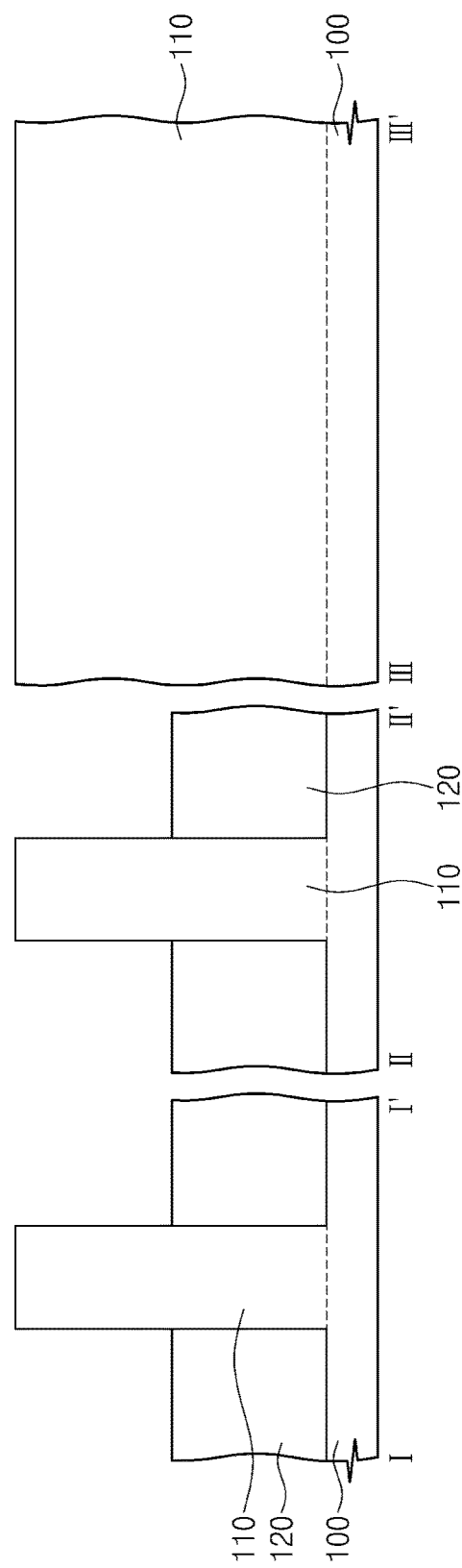

Referring to FIGS. 2A and 2B, an active pattern 110 and device isolation patterns 120 may be formed on a substrate 100. The substrate 100 may be formed of or include silicon.

In some example embodiments, the formation of the active pattern 110 may include forming a mask pattern on the substrate 100 and etching the substrate 100 using the mask pattern as an etch mask to form a trench extending in a first direction D1. As a result of the formation of the trench, the active pattern 110 may have a protruding structure extending in the first direction D1. The active pattern 110 may protrude in a third direction D3.

In certain example embodiments, the formation of the active pattern 110 may include forming a mask pattern on the substrate 100 and performing a selective epitaxial process on the substrate 100 exposed by the mask pattern. The active pattern 110 may protrude upward from the top surface of the substrate 100 and may extend in the first direction D1. Thereafter, the mask pattern may be removed to form trenches at both sides of the active pattern 110.

Device isolation patterns 120 may be formed at both sides of the active pattern 110. The device isolation patterns 120 may be formed to partially fill the trenches. The formation of the device isolation patterns 120 may include forming an insulating layer on the substrate 100 to fill the trenches and recessing an upper portion of the insulating layer to expose the top surface of the active pattern 110. The insulating layer may be formed of or include at least one of silicon oxide, silicon nitride, and silicon oxynitride. In certain example embodiments, a remaining portion of the mask pattern may be removed during the recessing of the insulating layer.

Figure 3A:
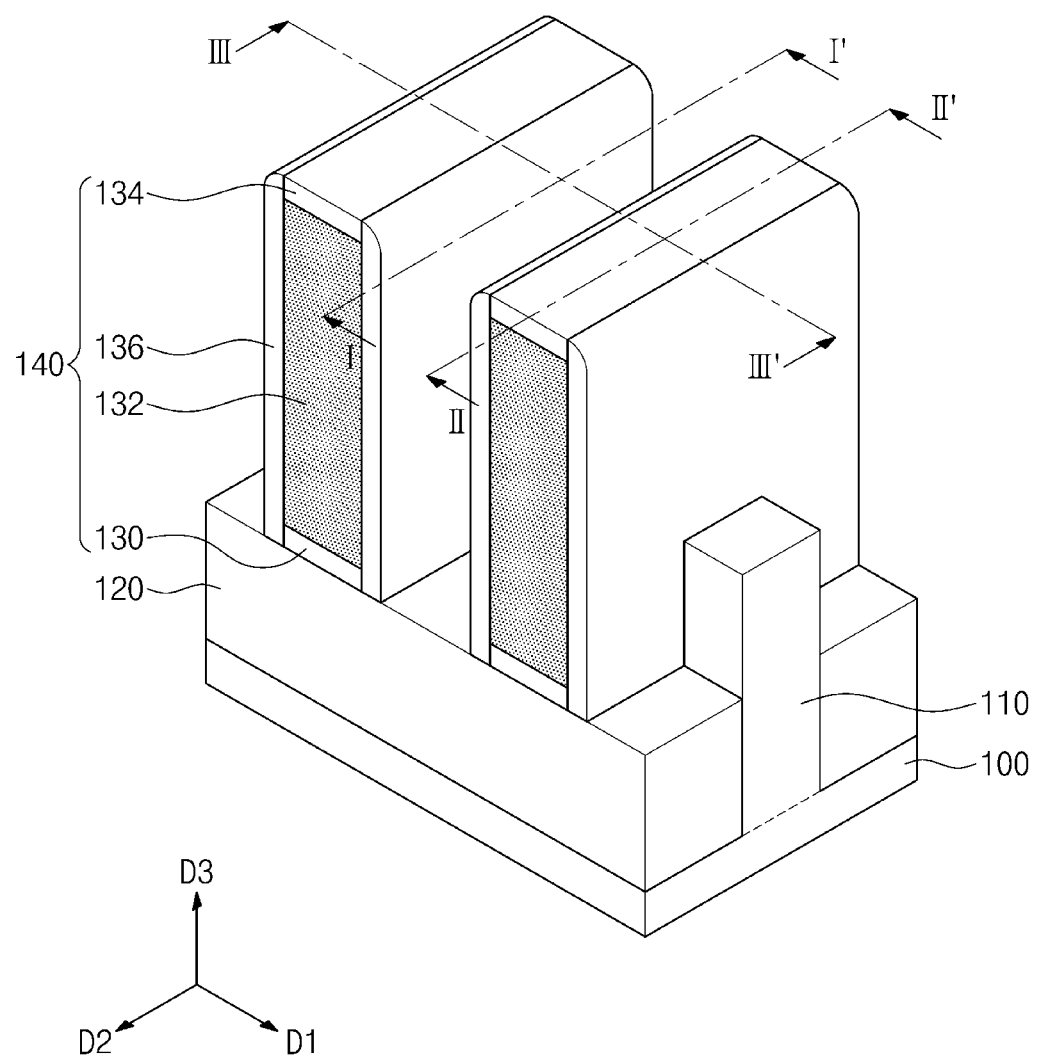
Figure 3B:
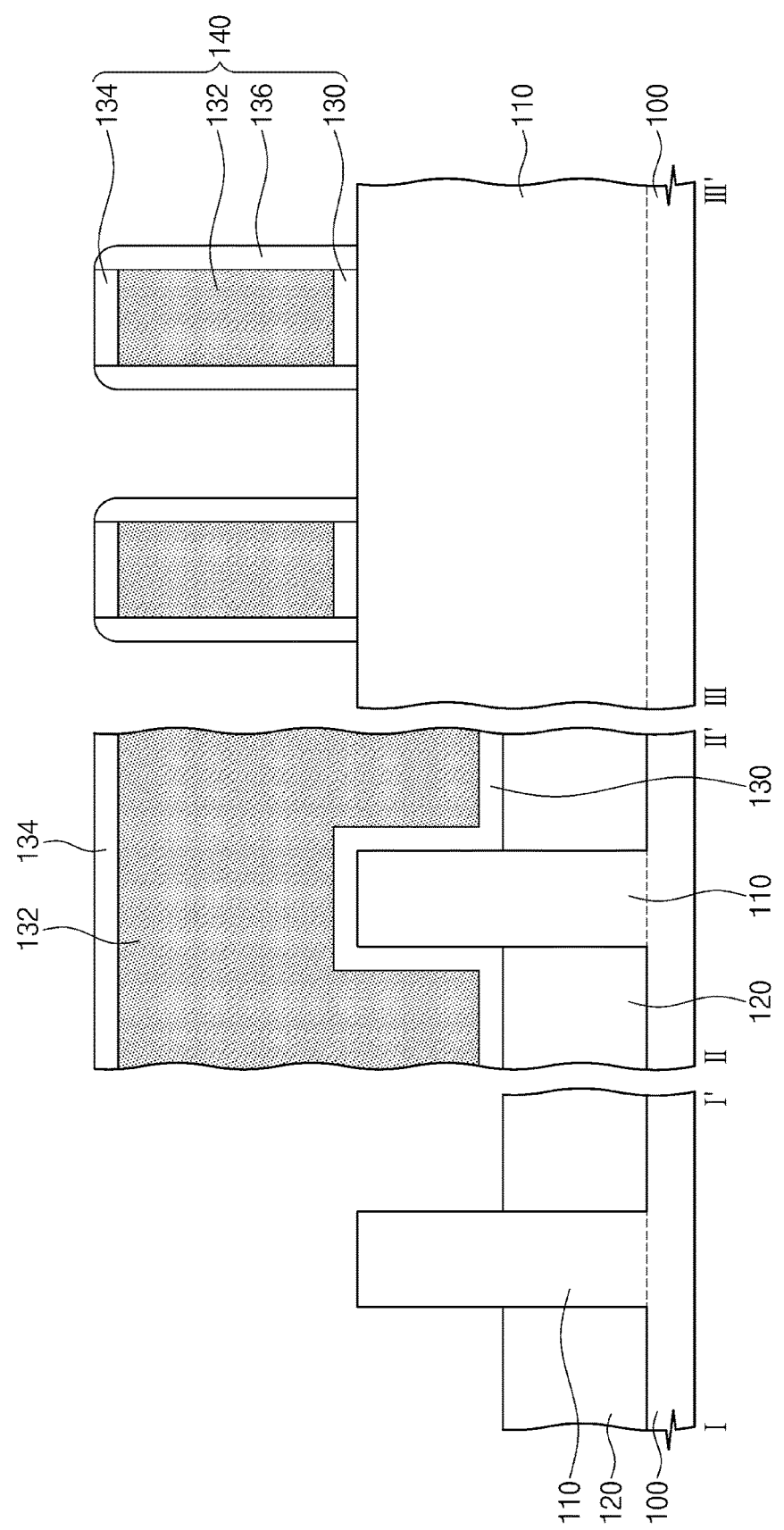

Referring to FIGS. 3A and 3B, preliminary gate structures 140 may be formed to cross the active pattern 110 and the device isolation patterns 120.

For example, an insulating layer and a sacrificial gate layer may be sequentially formed on the substrate 100 to cover the active pattern 110 and the device isolation patterns 120. The insulating layer may be formed of or include silicon oxide. The sacrificial gate layer may include a material having an etch selectivity with respect to the insulating layer. For example, the sacrificial gate layer may be formed of or include polysilicon.

Gate mask patterns 134 may be formed on the sacrificial gate layer, and the sacrificial gate layer and the insulating layer may be etched using the gate mask patterns 134 as an etch mask to form sacrificial gate patterns 132 and insulating patterns 130. The gate mask patterns 134 may be formed of or include silicon nitride. The gate mask patterns 134 and the insulating patterns 130 may be formed to extend in a second direction D2 crossing the first direction D1 and to be spaced apart from each other in the first direction D1.

Gate spacers 136 may be formed on opposite sidewalls of the insulating pattern 130, the sacrificial gate pattern 132, and the gate mask pattern 134. The formation of the gate spacers 136 may include forming a gate spacer layer to conformally cover the insulating pattern 130, the sacrificial gate pattern 132, and the gate mask pattern 134 and then, anisotropically etching the gate spacer layer. The gate spacer layer may be formed of or include silicon nitride.

Each of the preliminary gate structures 140 may include the insulating pattern 130, the sacrificial gate pattern 132, the gate mask pattern 134, and the gate spacers 136. The preliminary gate structures 140 may extend in the second direction D2 and may be spaced apart from each other in the first direction D1.

Figure 4A:
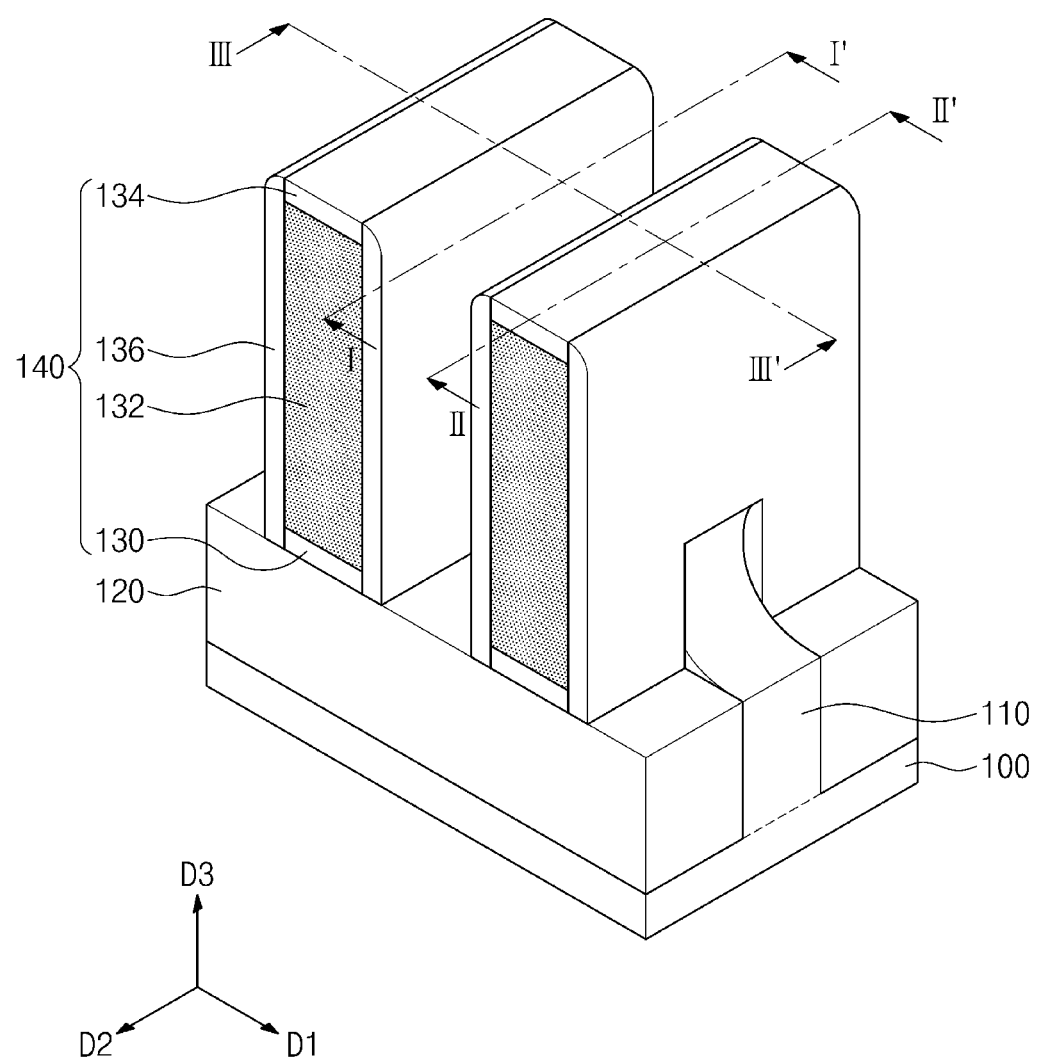
Figure 4B:
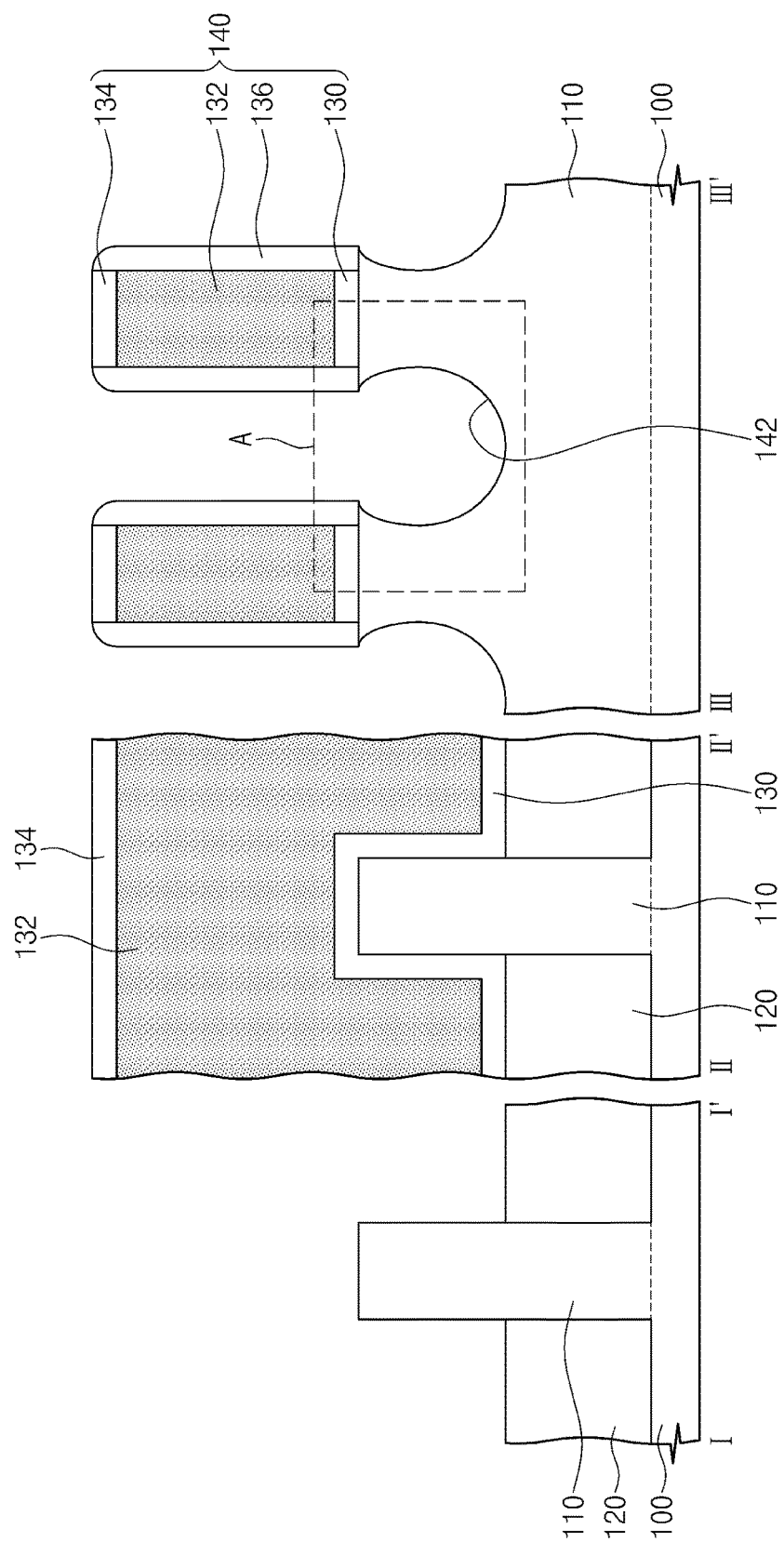
Figure 4C:
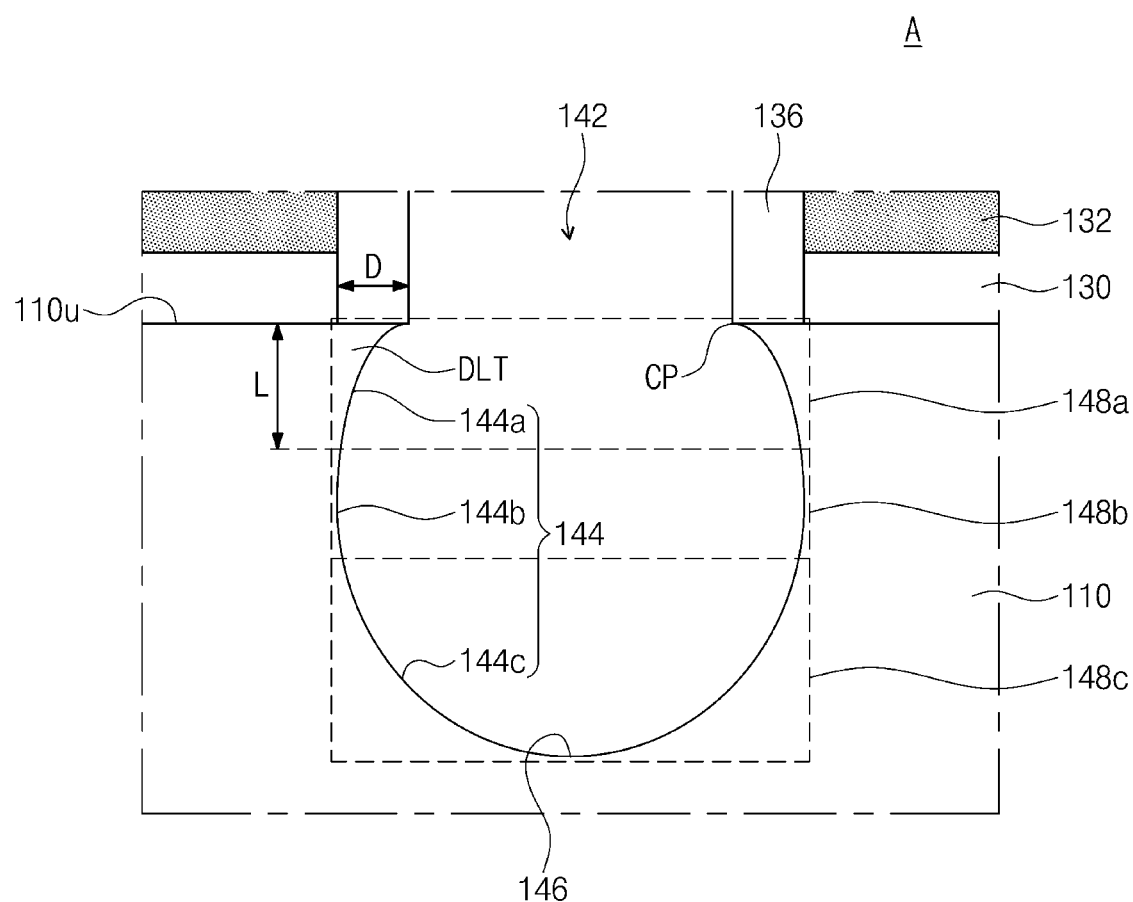

Referring to FIGS. 4A, 4B, and 4C, the active pattern 110 exposed by the preliminary gate structures 140 may be etched to form preliminary recess regions 142. In some example embodiments, the preliminary recess regions 142 may be formed by an anisotropic or isotropic etching process using at least one of $CF_3$, $Cl_2$, $NF_3$, and HBr gases.

For example, the preliminary recess region 142 may include first and second etching steps. The first etching step may be performed to etch the active pattern 110, in a depth or vertical direction, using the preliminary gate structures 140 as an etch mask. The first etching step may be performed, in an anisotropic manner, using at least one of $CF_3$, $Cl_2$, $NF_3$, and HBr gases. The second etching step may be performed to etch the active pattern 110, in a width or lateral direction. The second etching step may be performed, in an isotropic manner, using at least one of $CF_3$, $Cl_2$, $NF_3$, and HBr gases. The order or the repetition number of the first and second etching steps may be changed in consideration of a size or shape of the preliminary recess region 142.

The active pattern 110 exposed by the preliminary recess region 142 may have inner side surfaces 144 facing each other and a bottom surface 146 connected to the inner side surfaces 144. See FIG. 4C, the inner side surfaces 144 and the bottom surface 146 may be curvedly connected to each other. When viewed in a vertical section taken along the second direction D2, the preliminary recess region 142 may have top and bottom portions having relatively small widths and a wide intermediate portion. In the etching process, the gate spacers 136 may prevent the etching gas to pass therethrough, and thus, the top portion of the preliminary recess region 142 may have a relatively small width. Also, since it takes more time for the etching gas to be supplied to the bottom portion of the preliminary recess region 142, the preliminary recess region 142 may be formed to have the afore-described structure.

In some example embodiments, the preliminary recess region 142 may be defined by the inner side surfaces 144 and the bottom surface 146, and the preliminary recess region 142 may include a first region 148a having a downwardly increasing width, a second region 148b, which is provided below the first region 148a and has substantially the same width, and a third region 148c, which is provided below the second region 148b and has a downwardly decreasing width. In FIG. 4C, the width denotes a distance from the right inner side surface 144 to the left inner side surface.

The first region 148a may be defined by a first side surface 144a, which is connected to the top surface 110u of the active pattern 110 at an acute angle. The first side surface 144a may have a curved profile. The first side surface 144a and the top surface 110u of the active pattern 110 may be connected to define a cusp portion CP.

The second region 148b may be defined by a second side surface 144b, which is perpendicular to the top surface 110u of the active pattern 110. In some example embodiments, a vertical distance between two points, which are located on the second side surface 144b and the top surface 110u, respectively, may be L and a horizontal distance from the point on the top surface 110u to the cusp portion CP may be D. Hereinafter, a region defined by the two points and the first side surface 144a will be referred to as a 'delta region DLT'.

The third region 148c may be defined by a third side surface 144c, which is connected to the bottom surface 146. In some example embodiments, the third side surface 144c may be connected to the bottom surface 146 at an obtuse angle. In some exemplary embodiments, the third side surface 144c may have a curved profile.

Figure 5A:
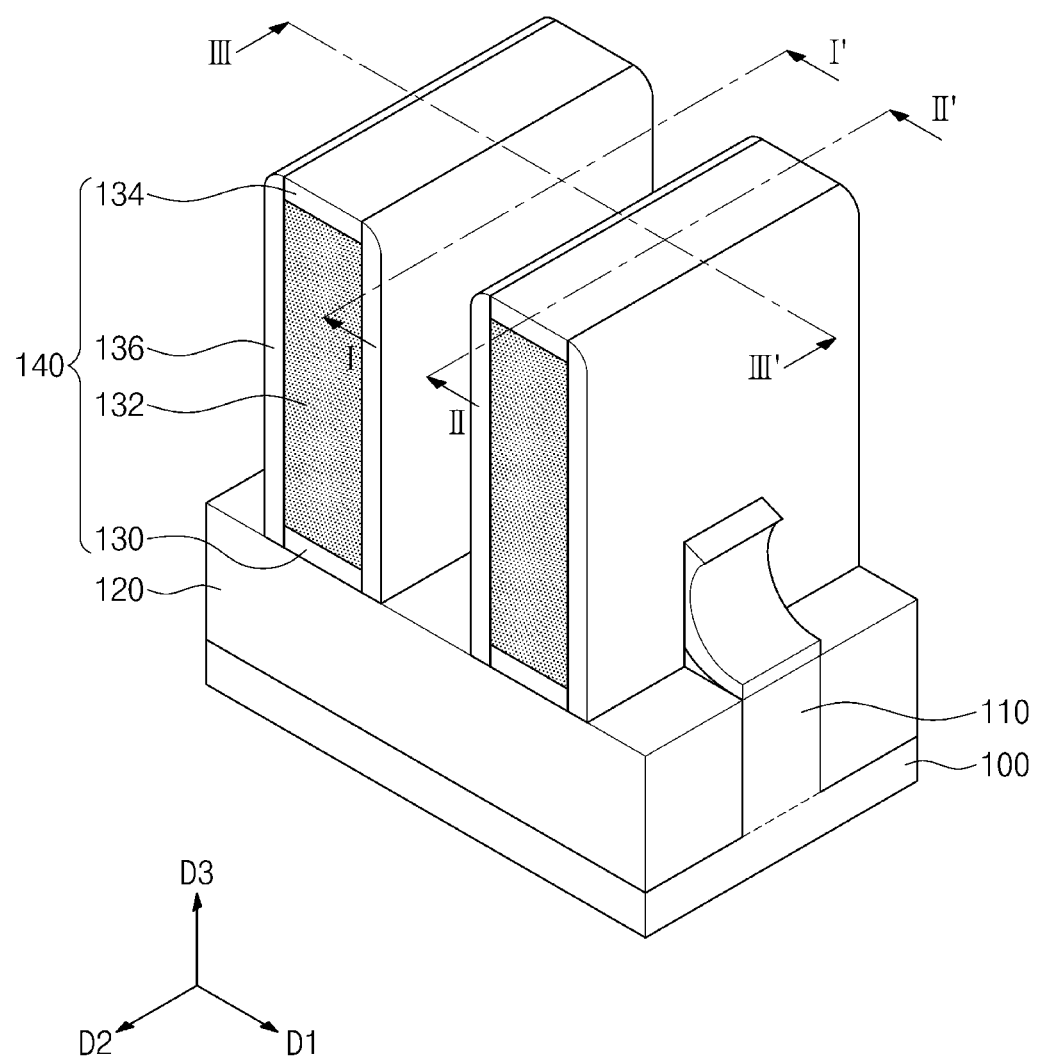
Figure 5B:
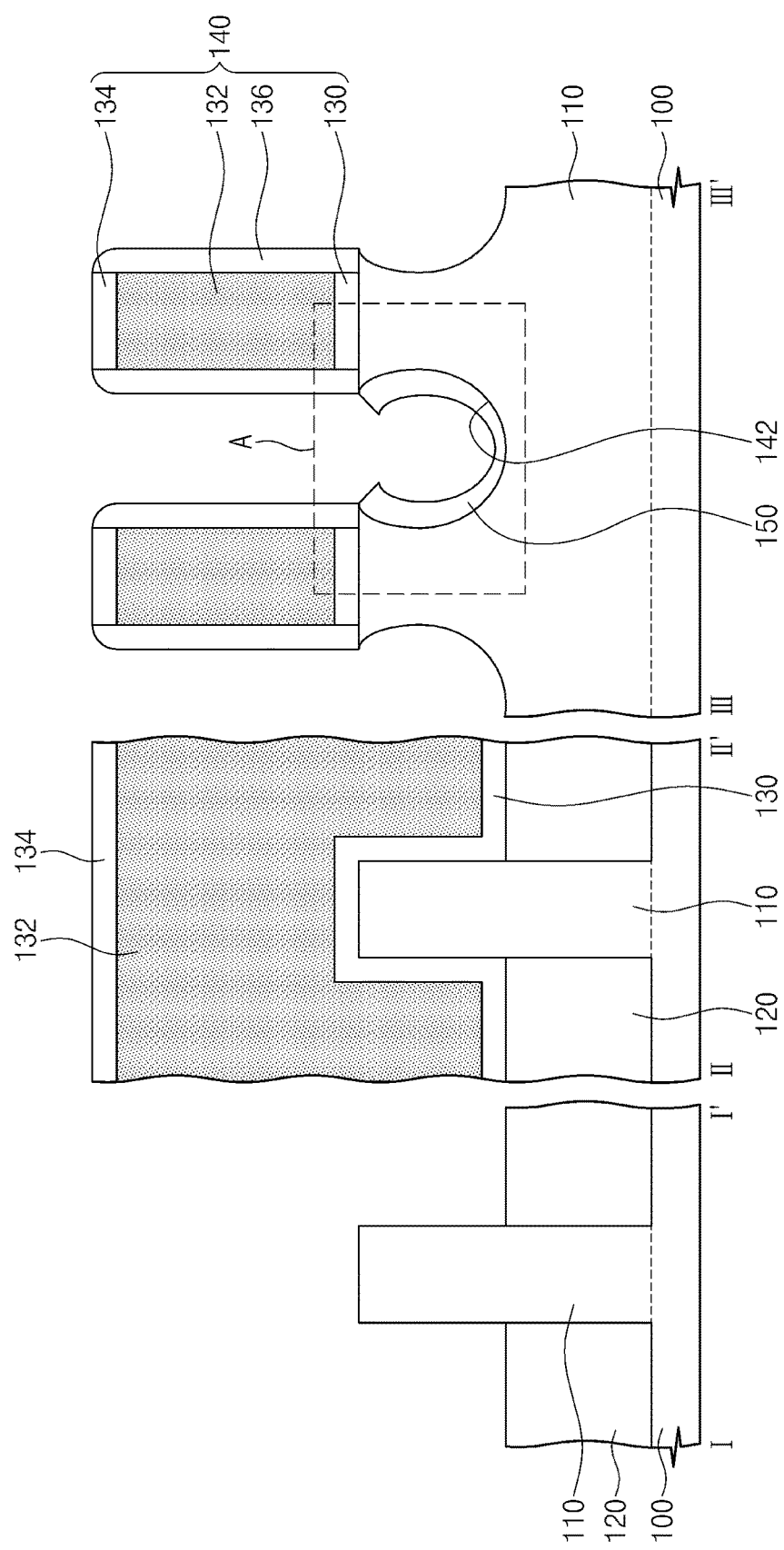
Figure 5C:
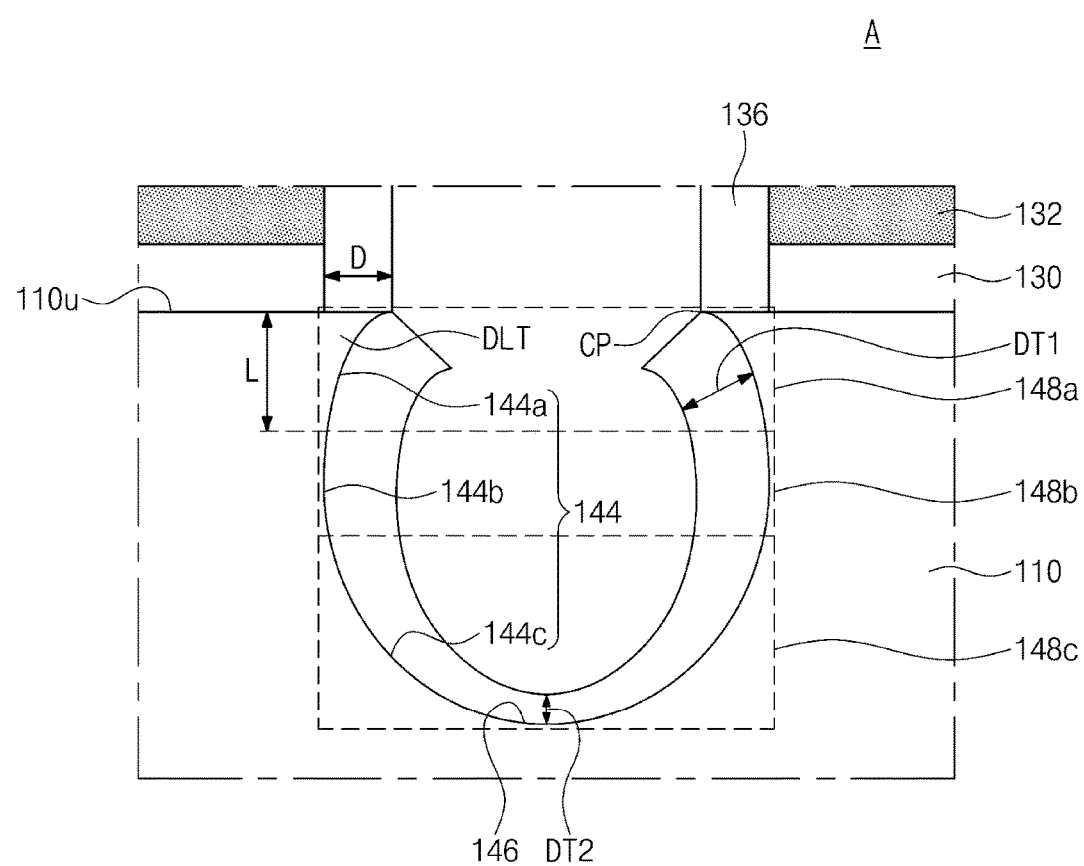

Referring to FIGS. 5A, 5B, and 5C, a selective epitaxial process may be performed to form a sacrificial layer 150 in the preliminary recess region 142. The sacrificial layer 150 may be formed to have a thickness ranging from about 1 nm to about 30 nm.

A difference in crystal structure between the first, second, and third side surfaces 144a, 144b, and 144c may lead to a difference in growth rate of the sacrificial layer 150 to be grown thereon. For example, the first side surface 144a may include a {111} crystal plane, the second side surface 144b may include a {110} crystal plane, and the third side surface 144c may include a {100} crystal plane. In the selective epitaxial process, a growth rate of the sacrificial layer 150 may be higher on the {111} and {110} crystal planes than on the {100} crystal plane. Accordingly, the sacrificial layer 150 may be formed to have a first thickness DT1 on the first and second regions 148a and 148b and have a second thickness DT2, which is smaller than the first thickness DT1, on the third region 148c. In some example embodiments, the first thickness DT1 may be greater by about 1-2 times than the second thickness DT2. The thickness of the sacrificial layer 150 may be adjusted in consideration of the size of the delta region DLT.

In certain example embodiments, the sacrificial layer 150 may be formed to expose the cusp portion CP. The cusp portion CP may be an end point of the first side surface 144a of the {111} crystal plane, and the sacrificial layer 150 may be grown from the cusp portion CP in a <111> direction.

According to some example embodiments, the sacrificial layer 150 may be formed of or include silicon germanium. The thickness of the sacrificial layer 150 may be controlled by adjusting a germanium concentration of the sacrificial layer 150. A growth rate of the sacrificial layer 150 may be in proportion to the germanium concentration of the sacrificial layer 150. In some example embodiments, the sacrificial layer 150 may be formed to have a germanium concentration of about 50% or lower. In the case where the germanium concentration of the sacrificial layer 150 is higher than 50%, the growth rate of the sacrificial layer 150 on the first or second side surface may be much lower than that on the bottom surface 146 and there may be a difficulty in forming the sacrificial layer 150 with a desired thickness.

In certain example embodiments, an etch rate of the sacrificial layer 150 may be controlled depending on the germanium concentration. The etch rate of the sacrificial layer 150 may be in proportion to the germanium concentration of the sacrificial layer 150.

In certain example embodiments, the sacrificial layer 150 may be formed of or include silicon. In this case, depending on crystal planes of the first side surface 144a, the second side surface 144b, and the third side surface 144c, the sacrificial layer 150 may be formed to have different thicknesses.

Figure 6A:
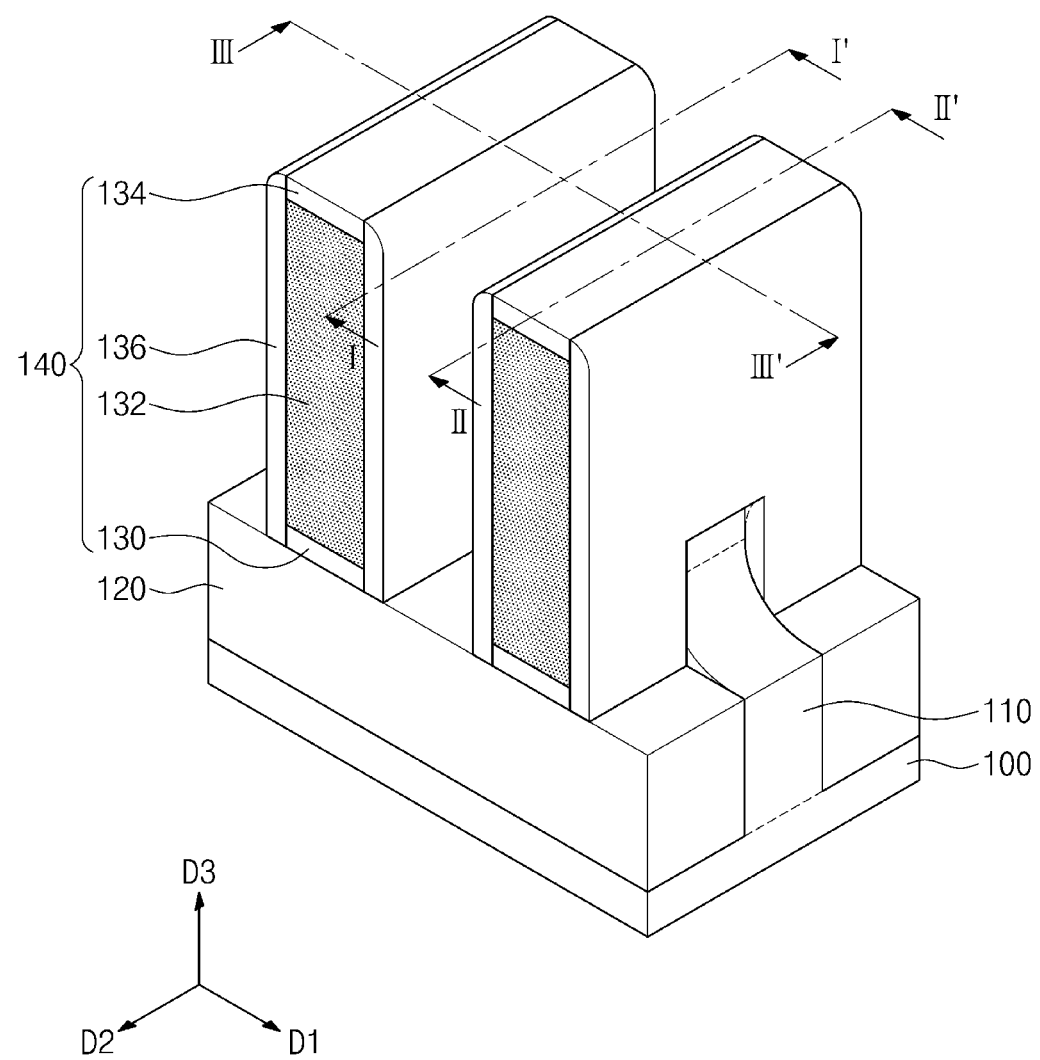
Figure 6B:
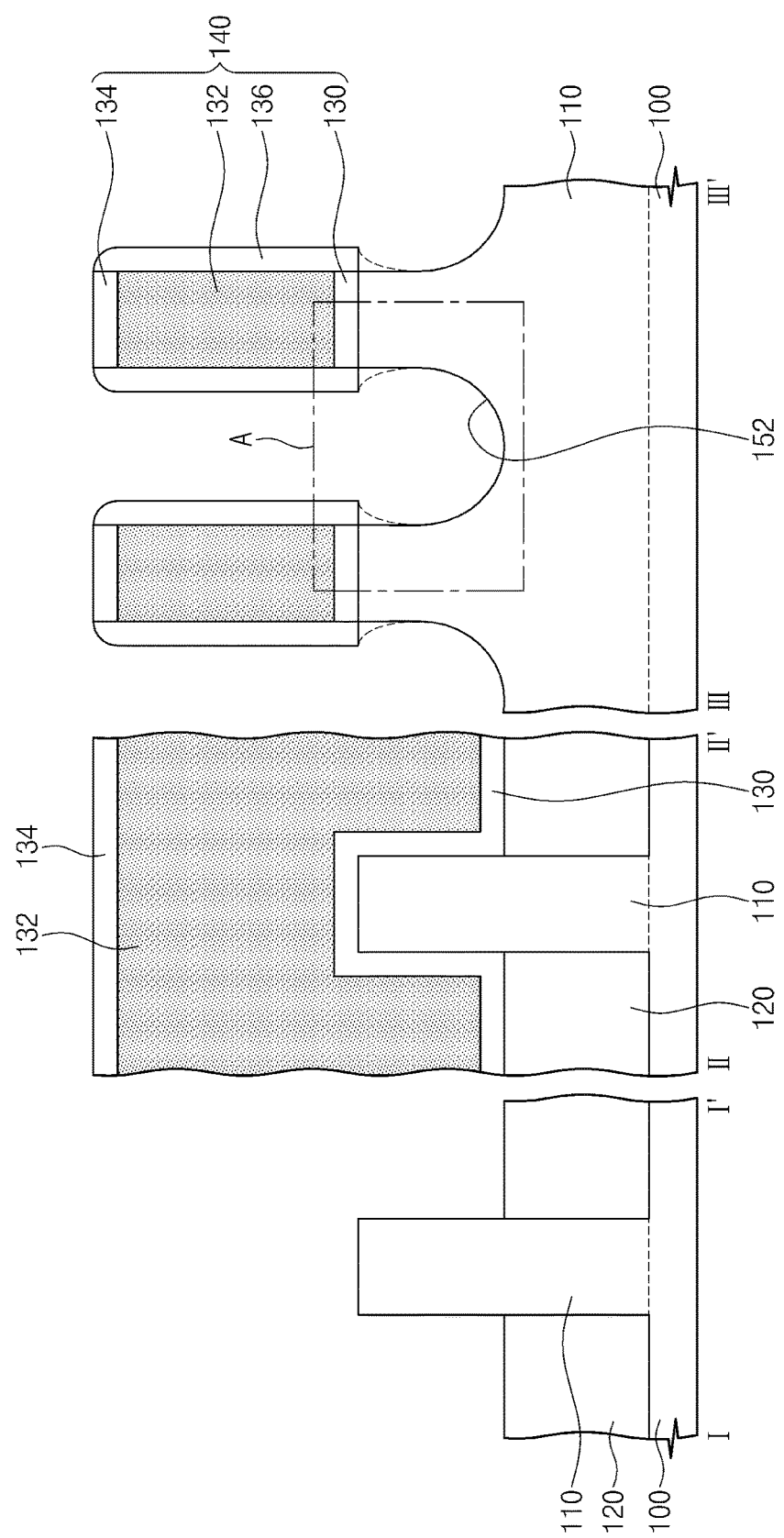
Figure 6C:
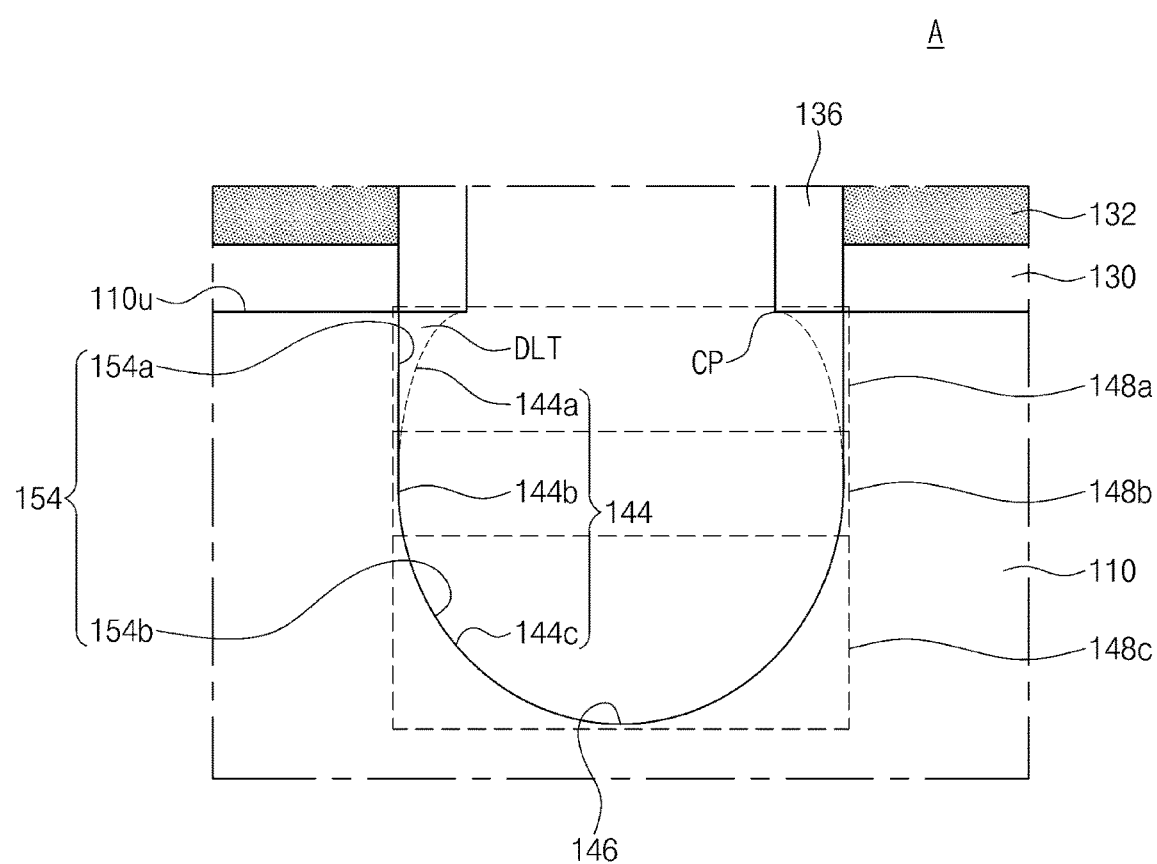

Referring to FIGS. 6A, 6B, and 6C, the sacrificial layer 150 and the delta region DLT of the active pattern 110 may be etched to form recess regions 152. The etching process may include a plasma etching process or a chemical etching process. The etching process may be performed using an etching gas containing at least one of $Cl_2$, HCl, $BCl_3$, and $Si_xH_yCl_z$. In certain example embodiments, the etching gas may further contain at least one of $GeH_4$ and $SiH_4$.

Similar to the growth rate of the sacrificial layer 150, the etch rate of the sacrificial layer 150 may be dependent on a position of the active pattern 110. According to some example embodiments, the etch rate of the sacrificial layer 150 may be higher at a portion of the sacrificial layer 150 grown in the <110> or <111> direction than at other portion of the sacrificial layer 150 grown in the <100> direction. For example, the growth and etch rates of the sacrificial layer 150 grown in the <110> or <111> direction may be higher by about 1-2 times than that in the <100> direction. Accordingly, even if the thickness of the sacrificial layer 150 formed on the first and second side surfaces 144a and 144b is greater than the thickness of the sacrificial layer 150 formed on the third side surface 144c, a portion of the sacrificial layer 150 may remain on the third side surface 144c, after the sacrificial layer 150 is removed from the first and second side surfaces 144a and 144b.

In the case where the sacrificial layer 150 contains silicon germanium, the sacrificial layer 150 and the active pattern 110 may be different from each other in terms of the etch rates of the sacrificial layer 150 and the active pattern 110. For example, an etch rate of silicon germanium may be higher than an etch rate of silicon. As a result, the thickness of the sacrificial layer 150 on the first and second side surfaces 144a and 144b may be greater than the thickness of the delta region DLT. Accordingly, after the removal of the delta region DLT, a portion of the sacrificial layer 150 may remain on the first and second side surfaces 144a and 144b. Meanwhile, in the case where the sacrificial layer 150 contains the silicon germanium, germanium concentration of the sacrificial layer 150 may be changed to etch the silicon germanium at an etch rate. The higher the germanium concentration, the higher the etch rate of the silicon germanium. For example, in the case where the germanium concentration of the sacrificial layer 150 is about 15%, the sacrificial layer 150 may be etched at an etch rate that is about two times that of silicon, and in the case where the germanium concentration is about 30%, the sacrificial layer 150 may be etched at an etch rate that is about three times that of silicon. As an example, in the case where the germanium concentration of the SiGe-containing sacrificial layer 150 is about 15%, the sacrificial layer 150 may be etched at an etch rate that is about two times that of the Si-containing active pattern 110, and the thickness DT1 (e.g., in FIG. 5C) of the sacrificial layer 150 formed on the first and second side surfaces 144a and 144b may be two times the horizontal length D of the delta region DLT. Meanwhile, the thickness DT2 (e.g., in FIG. 5C) of the sacrificial layer 150 formed on the third side surface 144c may be substantially equal to the horizontal length D of the delta region DLT.

In certain example embodiments, as shown in FIG. 5C, if the sacrificial layer 150 includes silicon, a thickness DT1 of the sacrificial layer 150 on the first and second side surfaces 144a and 144b of the active pattern 110 may be substantially equal to the horizontal length D of the delta region DLT. The sacrificial layer 150 on the third side surface 144c may have a thickness DT2 that is half the horizontal length D of the delta region DLT (i.e., D/2).

Since, during the etching process, the delta region DLT is removed and the sacrificial layer 150 is etched, the recess region 152 may be formed to have a 'U'-shaped section. As a result of the removal of the delta region DLT, the first side surface 144a of the active pattern 110 may be substantially perpendicular to the top surface 110u of the active pattern 110 and may be substantially coplanar with the second side surface 144b.

In some example embodiments, a portion of the sacrificial layer 150 may remain after the etching process. In certain example embodiments, the etching process may be performed to wholly remove the sacrificial layer 150.

As an example, in the case of a PMOSFET region, the source/drain regions SD filling the recess region may contain silicon germanium, and thus, if the sacrificial layer 150 contains silicon germanium, the remaining sacrificial layer 150 may be left and not removed. In this case, the remaining sacrificial layer 150 may be the first layer SDL1 of the source/drain regions SD described with reference to FIG. 1D. By contrast, in the case where the sacrificial layer 150 contains silicon, the remaining sacrificial layer 150 may be removed.

By contrast, in the case of an NMOSFET region, the source/drain regions SD filling the recess region may contain silicon, and thus, if the sacrificial layer 150 contains silicon, the remaining sacrificial layer 150 may be left and not removed. In this case, the remaining portion of the sacrificial layer 150 may be the first layer SDL1 of the source/drain region SD described with reference to FIG. 1D. By contrast, in the case where the sacrificial layer 150 contains silicon germanium, the remaining sacrificial layer 150 may be removed.

The active pattern 110 exposed by the recess region 152 may be formed to have inner side surfaces 154. The inner side surfaces 154 may include first inner side surfaces 154a, which are substantially perpendicular to the top surface 110u of the active pattern 110, and second inner side surfaces 154b, which are connected to the bottom surface 146. In some example embodiments, the second inner side surfaces 154b may be connected to the bottom surface 146 at an obtuse angle. An opposite pair of the first inner side surfaces 154a may be spaced apart from each other by substantially the same horizontal distance, and a horizontal distance between an opposite pair of the second sidewalls 154b may decrease in a direction from the top surface 110u of the active pattern 110 toward the bottom surface 146.

Figure 7A:
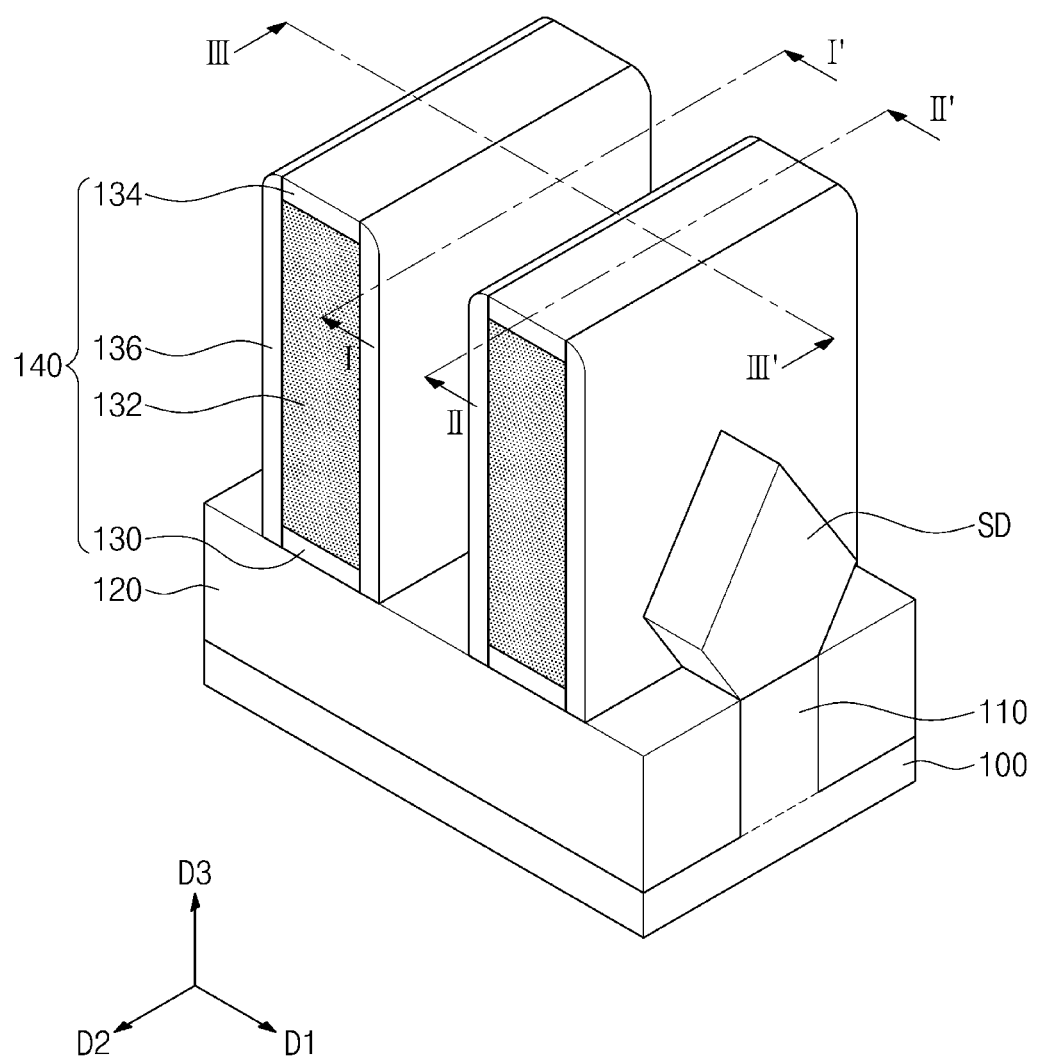
Figure 7B:
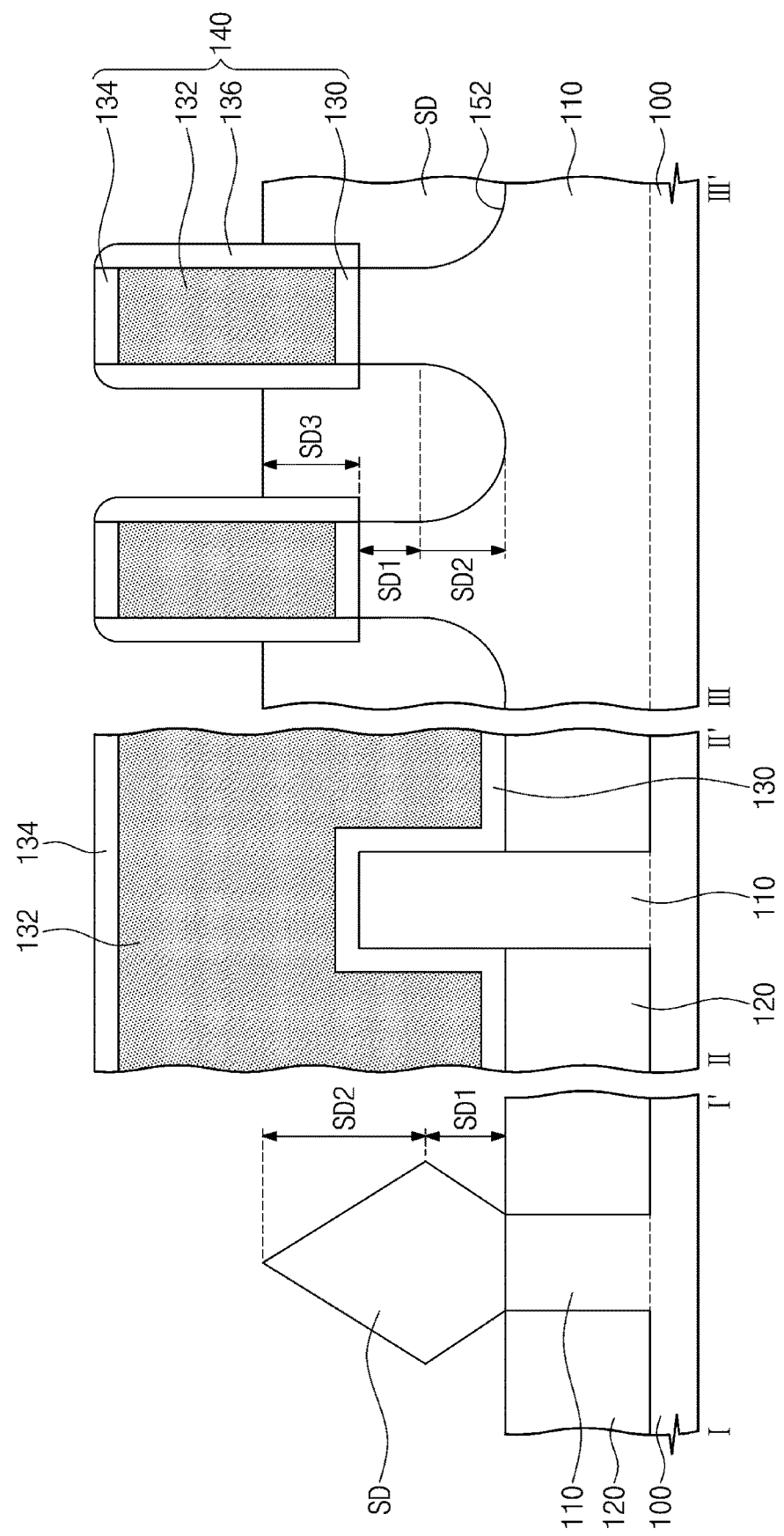

Referring to FIGS. 7A and 7B, source/drain regions SD may be formed to fill the recess region 152. The source/drain regions SD may be formed by performing a selective epitaxial growth process on the active pattern 110 and the substrate 100. The source/drain regions SD may be grown using the inner sides and bottom surface 154 and 146 exposed by the recess region 152 as a seed layer. As shown, the source/drain region SD may be grown to fill the recess region 152 and have a top surface higher than that of the active pattern 110. The source/drain regions SD may include a first source/drain portion SD1 and a second source/drain portion SD2, which are provided at a lower level than the top surface of the active pattern 110, and a third source/drain portion SD3, which is provided at a higher level than the top surface of the active pattern 110. The first source/drain portion SD1 may be in contact with the first sidewalls 154a, and the second source/drain portion SD2 may be in contact with the second sidewalls 154b and the bottom surface 146.

In some example embodiments, for PMOSFETs, the source/drain regions SD may be formed of or include silicon germanium. The source/drain regions SD may be doped with p-type dopants (e.g., boron) during or after the epitaxial growth process.

In certain example embodiments, for NMOSFETs, the source/drain regions SD may be formed of or include silicon or silicon carbide. The source/drain regions SD may be doped with n-type dopants (e.g., nitrogen) during or after the epitaxial growth process.

Figure 8A:
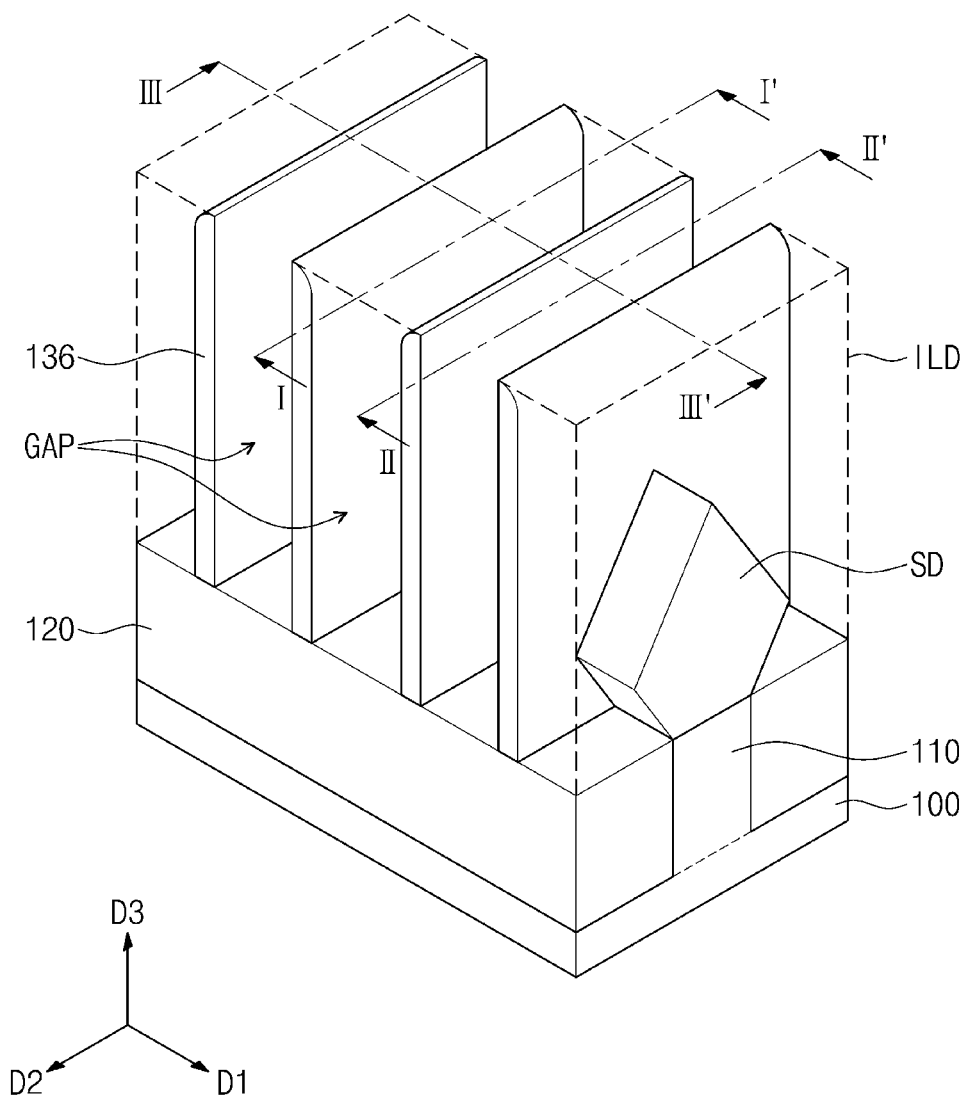
Figure 8B:
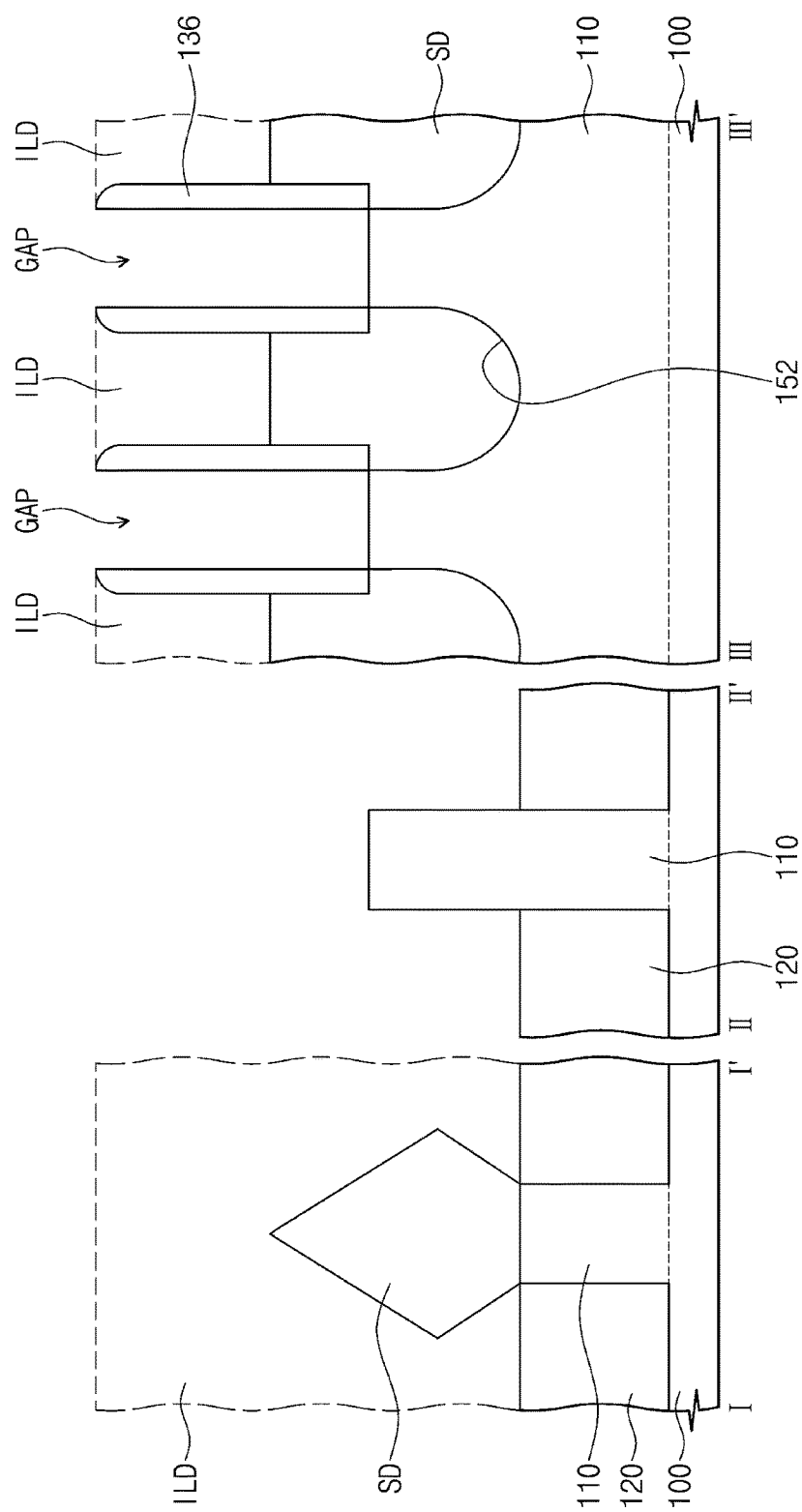

Referring to FIGS. 8A and 8B, a lower insulating layer ILD may be formed on the substrate 100 provided with the source/drain regions SD and the preliminary gate structure 140. The lower insulating layer ILD may be formed to cover the source/drain regions SD and the preliminary gate structure 140. The lower insulating layer ILD may be formed of or include at least one of silicon oxide, silicon nitride, and silicon oxynitride.

The gate mask pattern 134, the sacrificial gate pattern 132, and the insulating pattern 130 may be removed to form a gap region GAP between the gate spacers 136. The gap region GAP may be formed to expose top and side surfaces of the active pattern 110.

Figure 9A:
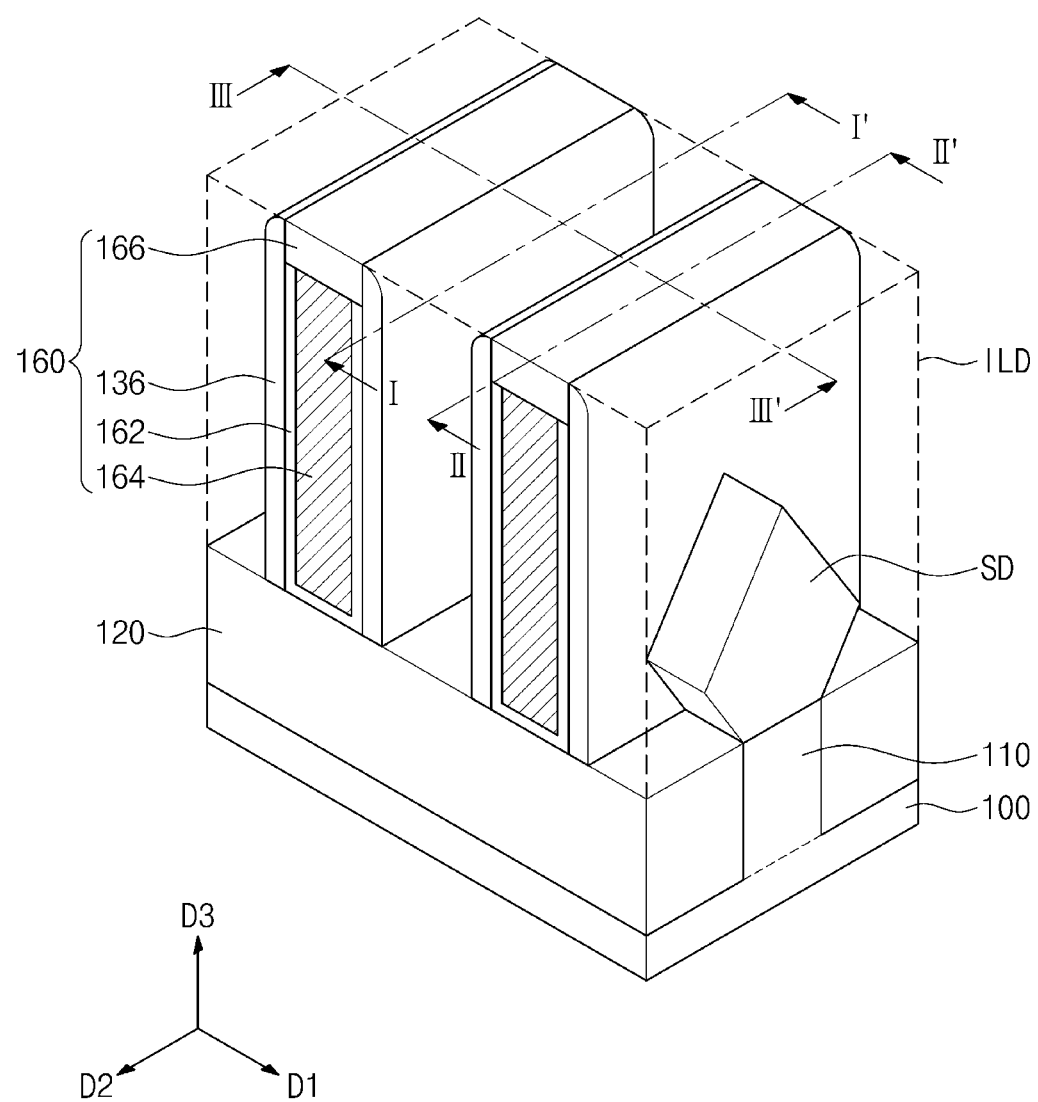
Figure 9B:
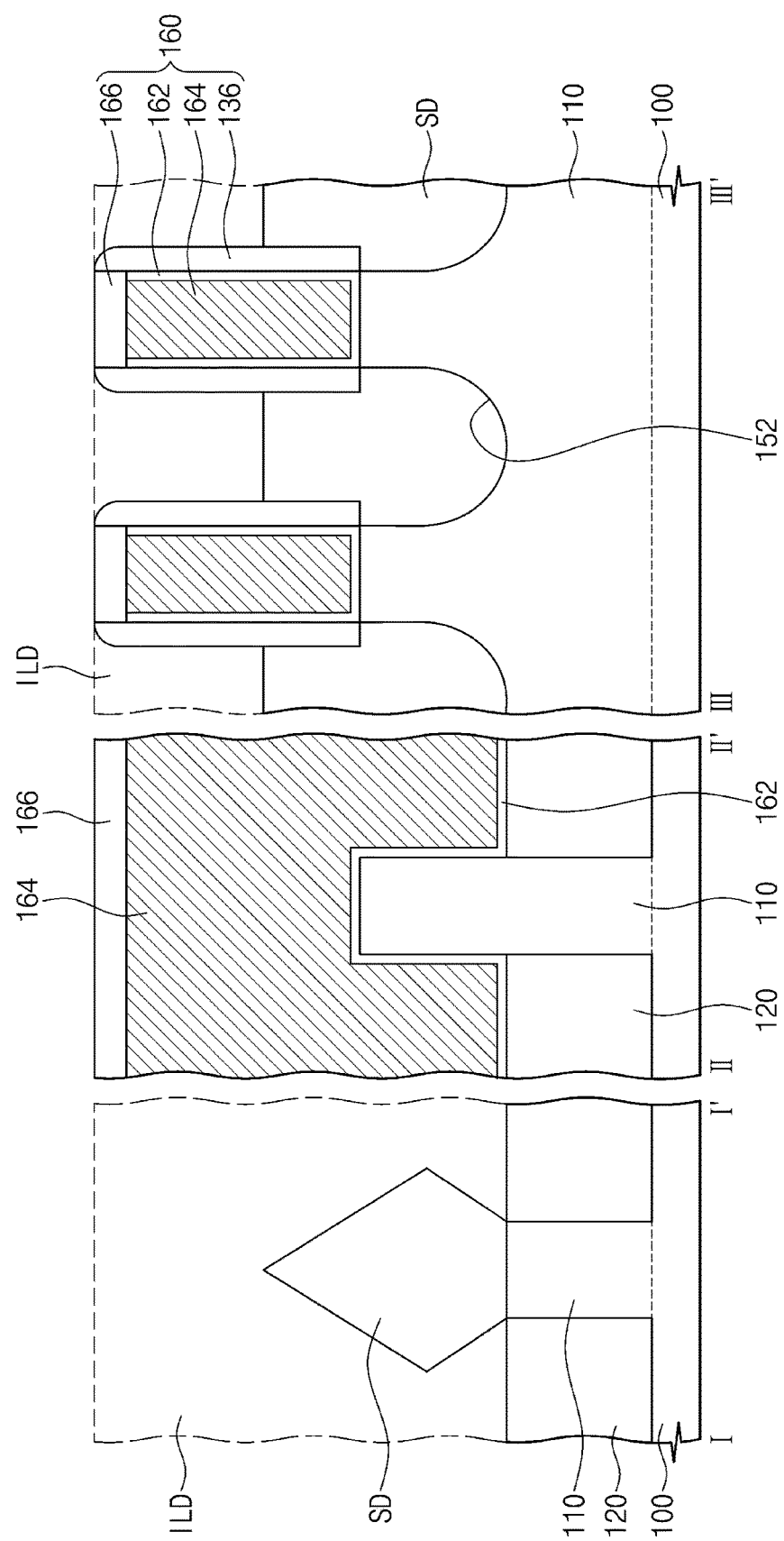

Referring to FIGS. 9A and 9B, a gate insulating pattern 162 and a gate electrode 164 may be formed in the gap region GAP.

For example, a gate insulating layer may be formed to conformally cover the exposed top and side surfaces of the active pattern 110 and the gate spacers 136. The gate insulating layer may be formed of or include at least one of hafnium oxide, hafnium silicate, zirconium oxide, and zirconium silicate, but the inventive concept may not be limited thereto. The gate insulating layer may be formed by for example, an atomic layer deposition process.

A gate layer may be formed on the gate insulating layer to fill the gap region GAP. The gate layer may include at least one of conductive metal nitrides (e.g., titanium nitride or tantalum nitride) or at least one of metals (e.g., aluminum, tungsten, or copper).

A planarization process may be performed on the gate layer and the gate insulating layer to expose the top surfaces of the gate spacers 136, and thus, the gate insulating pattern 162 and the gate electrode 164 may be formed. The gate insulating pattern 162 may be provided between the gate electrode 164 and a pair of the gate spacers 136 and may have a 'U'-shaped section.

An upper portion of the gate electrode 164 may be partially etched to form a gate recess region. A portion of the gate insulating pattern 162 may be etched during the formation of the gate recess region. The gate recess region may be formed in the gap region GAP. A capping pattern 166 may be formed in the gate recess region. The capping pattern 166 may be formed of or include silicon nitride.

The gate electrode 164, the gate insulating pattern 162, the capping pattern 166, and the pair of the gate spacers 136 may constitute a gate structure 160.

An upper interlayered insulating layer may be formed on the lower interlayered insulating layer ILD, which is formed to cover the gate structure 160 and the source/drain regions SD. The upper interlayered insulating layer may be formed of or include at least one of silicon oxide, silicon nitride, and silicon oxynitride. Contact holes may be formed to penetrate the upper interlayered insulating layer and the lower interlayered insulating layer ILD and to expose the source/drain regions SD. During an etching process for forming the contact holes, top portions of the source/drain regions SD may be partially removed, as shown in FIGS. 1A and 1B. Contact plugs may be formed by filling the contact holes with a conductive material. The contact plugs may be electrically connected to the source/drain regions SD, respectively.

In a method of fabricating a semiconductor device according to some example embodiments, a sacrificial layer may be grown to have a position-dependent thickness in a preliminary recess region, and thus, it is possible to protect a lower region of the preliminary recess region during a process of removing a delta region and thereby to form a recess region with a 'U'-shaped section.

In addition, by controlling a material for the sacrificial layer and a composition ratio of the material, it is possible to control growth and etch rates of the sacrificial layer in consideration of a size of the delta region.

The recess regions with the 'U'-shaped section may be filled with source/drain regions, and a channel region between the source/drain regions can be formed to have substantially the same horizontal distance. This may make it possible to improve electric reliability of a semiconductor device.

While example embodiments have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:
   forming an active pattern protruding orthogonally from a substrate;
   forming a preliminary gate structure on the active pattern to cross the active pattern;
   etching the active pattern to form preliminary recess regions at both sides of the preliminary gate structure, wherein each of the preliminary recess regions is formed to define a delta region in an upper portion of the active pattern;
   forming a sacrificial layer on inner side surfaces and a bottom surface of the active pattern exposed by each of the preliminary recess regions;
   etching the delta regions and the sacrificial layer to form recess regions having a 'U'-shaped section; and
   forming source/drain regions in the recess regions, respectively.

2. The method of claim 1, wherein the sacrificial layer comprises silicon or silicon germanium.

3. The method of claim 1, wherein the sacrificial layer comprises silicon germanium and is formed to have a germanium concentration of about 50% or lower.

4. The method of claim 1, wherein the sacrificial layer is formed to have a thickness ranging from about 1 nm to about 30 nm.

5. The method of claim 1, wherein the forming of the sacrificial layer is performed using a selective epitaxial growth process, and
   a growth rate of the sacrificial layer on the delta region is higher than a growth rate of the sacrificial layer on a bottom surface of the active pattern.

6. The method of claim 5, wherein the growth rate of the sacrificial layer on the delta region is at most two times the growth rate of the sacrificial layer on the bottom surface.

7. The method of claim 1, wherein the etching of the delta region and the sacrificial layer is performed using at least one of a plasma etching method and a chemical etching method.

8. The method of claim 1, wherein the etching of the delta region and the sacrificial layer is performed using at least one of $Cl_2$, $HCl$, $BCl_3$, and $Si_xH_yCl_z$.

9. The method of claim 8, wherein the etching of the delta region and the sacrificial layer is performed using at least one of $GeH_4$ and $SiH_4$.

10. The method of claim 1, wherein the sacrificial layer is formed to have a non-uniform thickness.

11. The method of claim 1, wherein a thickness of the sacrificial layer is dependent on a size of the delta region.

12. The method of claim 11, wherein the sacrificial layer comprises silicon germanium, and a growth rate of the sacrificial layer is dependent on a germanium concentration of the sacrificial layer.

13. The method of claim 12, wherein the growth rate of the sacrificial layer is in proportional to the germanium concentration of the sacrificial layer.

14. The method of claim 1, wherein the preliminary recess region comprises:
  a first region having an increasing width in a direction from a top surface of the active pattern to the bottom surface,
  a second region provided below the first region, the second region having substantially a same width in the direction from the top surface to the bottom surface, and
  a third region provided below the second region to have a downwardly decreasing width in the direction from the top surface to the bottom surface.

15. The method of claim 14, wherein the first region has a first side surface including a {111} crystal plane,
  the second region has a second side surface including a {110} crystal plane,
  the third region has a third side surface including a {100} crystal plane, and
  the sacrificial layer on the first and second side surfaces has a thickness that is greater than a thickness of the sacrificial layer on the third side surface.

16. A method of fabricating a semiconductor device, the method comprising:
  forming an active pattern on a substrate, the active pattern being orthogonal to the substrate;
  forming at least two preliminary gate structures on the active pattern to cross the active pattern;
  etching the active pattern between the preliminary gate structures to form a preliminary recess region extending into the active pattern in a recess direction, side portions of the preliminary recess region extending under a portion of the preliminary gate structures;
  forming a sacrificial layer on the active pattern of the preliminary recess region, the sacrificial layer having a position-dependent thickness in the preliminary recess region;
  etching the sacrificial layer to form a recess region; and
  forming a source/drain region in the recess region.

17. The method of claim 16, wherein the sacrificial layer comprises silicon germanium, and a growth rate of the sacrificial layer is dependent on a germanium concentration of the sacrificial layer.

18. A method of fabricating a semiconductor device, the method comprising:
  forming a pattern structure on an etch target layer;
  etching the etch target layer using the pattern structure as an etch mask to form a preliminary recess region; and
  epitaxially forming a sacrificial layer on the preliminary recess region,
  wherein a growth rate of the sacrificial layer at an upper region of the preliminary recess region is higher than a growth rate of the sacrificial layer at a lower region of the preliminary recess region.

19. The method of claim 18, wherein the growth rate of the sacrificial layer at the upper region of the preliminary recess region is one to two times the growth rate of the sacrificial layer at the lower region of the preliminary recess region.

20. The method of claim 18, wherein the preliminary recess region comprises:
  a first region having an increasing width in a direction from a top surface of the etch target layer to the bottom surface,
  a second region provided below the first region, the second region having substantially the same width in the direction from the top surface to the bottom surface, and
  a third region provided below the second region to have a downwardly decreasing width in the direction from the top surface to the bottom surface.

* * * * *